(12) United States Patent
Tamakuni et al.

(10) Patent No.: US 10,971,686 B2
(45) Date of Patent: Apr. 6, 2021

(54) ORGANIC SEMICONDUCTOR ELEMENT, POLYMER, ORGANIC SEMICONDUCTOR COMPOSITION, AND ORGANIC SEMICONDUCTOR FILM

(71) Applicant: FUJIFILM Corporation, Tokyo (JP)

(72) Inventors: Fumiko Tamakuni, Kanagawa (JP); Yosuke Yamamoto, Kanagawa (JP); Tetsuya Watanabe, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 75 days.

(21) Appl. No.: 16/141,429

(22) Filed: Sep. 25, 2018

(65) Prior Publication Data

US 2019/0027691 A1 Jan. 24, 2019

Related U.S. Application Data

(63) Continuation of application No. PCT/JP2017/012173, filed on Mar. 24, 2017.

(30) Foreign Application Priority Data

Apr. 1, 2016 (JP) .............................. JP2016-074078

(51) Int. Cl.
*H01L 51/00* (2006.01)
*C08G 61/12* (2006.01)
(Continued)

(52) U.S. Cl.
CPC .......... *H01L 51/0036* (2013.01); *C08G 61/12* (2013.01); *C08G 61/126* (2013.01);
(Continued)

(58) Field of Classification Search
CPC .............................. H01L 51/52; C07D 487/04
(Continued)

(56) References Cited

U.S. PATENT DOCUMENTS

2007/0096079 A1 5/2007 Nakayama et al.
2007/0228359 A1 10/2007 Heim et al.
(Continued)

FOREIGN PATENT DOCUMENTS

JP 2005-354012 A 12/2005
JP 2006-303465 A 11/2006
(Continued)

OTHER PUBLICATIONS

An Office Action mailed by the Japanese Patent Office dated Jul. 30, 2019, which corresponds to Japanese Patent Application No. 2018-509272 and is related to U.S. Appl. No. 16/141,429; with English language translation.
(Continued)

*Primary Examiner* — Khanh T Nguyen
(74) *Attorney, Agent, or Firm* — Studebaker & Brackett PC

(57) ABSTRACT

Provided are an organic semiconductor element including an organic semiconductor film that includes a polymer having a repeating unit represented by the following Formula (1), the polymer, and an organic semiconductor composition and an organic semiconductor film including the polymer.

(1)

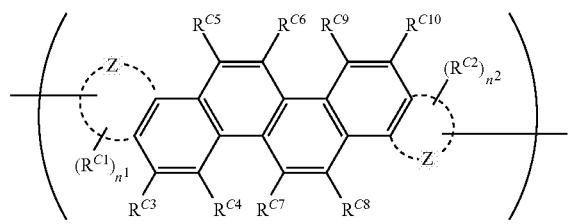

In the formula, Z represent a 5-membered aromatic heterocycle. $R^{C1}$ and $R^{C2}$ each independently represent a halogen atom, an alkyl group, an alkenyl group, an alkynyl group, an aromatic hydrocarbon group, or an aromatic heterocyclic group. $n^1$ and $n^2$ each independently represent 0 or 1. $R^{C3}$ to $R^{C10}$ each independently represent a hydrogen atom, a
(Continued)

halogen atom, an alkyl group, an alkenyl group, an alkynyl group, an aromatic hydrocarbon group, or an aromatic heterocyclic group.

13 Claims, 2 Drawing Sheets

(51) Int. Cl.
H01L 51/10 (2006.01)
H01L 51/05 (2006.01)

(52) U.S. Cl.
CPC ...... *H01L 51/0003* (2013.01); *H01L 51/0035* (2013.01); *H01L 51/0043* (2013.01); *C08G 2261/124* (2013.01); *C08G 2261/1412* (2013.01); *C08G 2261/1424* (2013.01); *C08G 2261/18* (2013.01); *C08G 2261/228* (2013.01); *C08G 2261/3223* (2013.01); *C08G 2261/3229* (2013.01); *C08G 2261/3241* (2013.01); *C08G 2261/3242* (2013.01); *C08G 2261/3243* (2013.01); *C08G 2261/3244* (2013.01); *C08G 2261/3246* (2013.01); *C08G 2261/3327* (2013.01); *C08G 2261/344* (2013.01); *C08G 2261/414* (2013.01); *C08G 2261/51* (2013.01); *C08G 2261/592* (2013.01); *C08G 2261/92* (2013.01); *H01L 51/0558* (2013.01); *H01L 51/107* (2013.01)

(58) Field of Classification Search
USPC .......................................................... 257/40
See application file for complete search history.

(56) References Cited

U.S. PATENT DOCUMENTS

| | | |
|---|---|---|
| 2010/0099840 A1 | 4/2010 | Moon et al. |
| 2010/0283047 A1 | 11/2010 | Facchetti et al. |
| 2010/0297405 A1 | 11/2010 | Flores et al. |
| 2011/0127512 A1 | 6/2011 | Goto et al. |
| 2011/0210319 A1 | 9/2011 | Nakano et al. |
| 2012/0322966 A1 | 12/2012 | Bazan et al. |
| 2013/0146851 A1 | 6/2013 | Facchetti et al. |
| 2013/0256604 A1 | 10/2013 | Blouin et al. |
| 2013/0302726 A1 | 11/2013 | Tsuchimura et al. |
| 2014/0001411 A1 | 1/2014 | Blouin et al. |
| 2015/0014599 A1 | 1/2015 | Griffiths |
| 2016/0104842 A1 | 4/2016 | Takeya et al. |
| 2018/0159053 A1 | 6/2018 | Koyanagi et al. |
| 2019/0112417 A1 | 4/2019 | Okamoto et al. |

FOREIGN PATENT DOCUMENTS

| | | |
|---|---|---|
| JP | 2007-516315 A | 6/2007 |
| JP | 2010-018790 A | 1/2010 |
| JP | 2010-527327 A | 8/2010 |
| JP | 2010-285518 A | 12/2010 |
| JP | 2011-501451 A | 1/2011 |
| JP | 2011-514399 A | 5/2011 |
| JP | 2011-514913 A | 5/2011 |
| JP | 2011-186069 A | 9/2011 |
| JP | 2012-163946 A | 8/2012 |
| JP | 2013-207085 A | 10/2013 |
| JP | 2013-214649 A | 10/2013 |
| JP | 2014-507488 A | 3/2014 |
| JP | 2014-078729 A | 5/2014 |
| JP | 2014-515043 A | 6/2014 |
| JP | 2015-502937 A | 1/2015 |
| JP | 2015-032716 A | 2/2015 |
| JP | 2015-515505 A | 5/2015 |
| WO | 2010/024388 A1 | 3/2010 |
| WO | 2012/174561 A2 | 12/2012 |
| WO | 2014/175351 A1 | 10/2014 |
| WO | 2017/022761 A1 | 2/2017 |
| WO | 2017/170245 A1 | 10/2017 |

OTHER PUBLICATIONS

International Search Report issued in PCT/JP2017/012173; dated Jun. 13, 2017.
International Preliminary Report on Patentability and Written Opinion issued in PCT/JP2017/012173; dated Oct. 2, 2018.

ORGANIC SEMICONDUCTOR ELEMENT, POLYMER, ORGANIC SEMICONDUCTOR COMPOSITION, AND ORGANIC SEMICONDUCTOR FILM

CROSS-REFERENCE TO RELATED APPLICATIONS

This application is a Continuation of PCT International Application No. PCT/JP2017/012173 filed on Mar. 24, 2017, which claims priorities under 35 U.S.C. § 119 (a) to Japanese Patent Application No. JP2016-074078 filed on Apr. 1, 2016. Each of the above applications is hereby expressly incorporated by reference, in its entirety, into the present application.

BACKGROUND OF THE INVENTION

1. Field of the Invention

The present invention relates to an organic semiconductor element, and a polymer, an organic semiconductor composition, and an organic semiconductor film used in the organic semiconductor element.

2. Description of the Background Art

In a display such as a liquid crystal display or an organic electroluminescence display, a device using a logical circuit such as a radio frequency identifier (RFID (RF tag)) or a memory, a solar cell, or the like, a semiconductor element is used. In particular, an organic semiconductor element including an organic semiconductor film can realize weight reduction or cost reduction and also has excellent flexibility. Therefore, the organic semiconductor element including an organic semiconductor film is superior to an inorganic semiconductor element including an inorganic semiconductor film.

As an organic compound forming the organic semiconductor film, an organic low molecular weight compound having a fused ring structure is considered. For example, a low molecular weight compound in which a thiophene ring, a furan ring, or a pyrrole ring is fused to each of benzene rings at both terminals of chrysene is disclosed (JP2014-078729A and WO2010/024388A). In addition, JP2015-032716A and JP2015-502937A disclose a low molecular weight compound in which a pyrrole ring is fused to each of benzene rings at both terminals of chrysene.

SUMMARY OF THE INVENTION

The performance of the above-described display or the like has been rapidly improved, and for an organic semiconductor element mounted on the display or the like, for example, improvement of a carrier mobility is required to further improve performance.

Further, an organic semiconductor element or an organic semiconductor film may be exposed to a high-temperature environment. Therefore, heat resistance with which a carrier mobility can be maintained even under high temperature conditions is required. Examples of the high-temperature environment include high temperature conditions during the manufacturing of an organic semiconductor element, further, the use of an organic semiconductor element in a high-temperature environment.

However, an organic semiconductor element of the related art is not sufficient in carrier mobility and heat resistance and has a room for improvement.

An object of the present invention is to provide an organic semiconductor element having high carrier mobility and high heat resistance, and a polymer, an organic semiconductor composition, and an organic semiconductor film used in the organic semiconductor element.

As a result of thorough investigation, the present inventors found that a polymer that includes a repeating unit having a chrysene fused ring group in which a specific 5-membered aromatic heterocycle is fused to each of benzene rings at both terminals of a chrysene ring structure, preferably, further having a specific conjugated group can be used as an organic semiconductor film in an organic semiconductor element. Further, the present inventors found that, by using this polymer as an organic semiconductor film, high carrier mobility and high heat resistance can be simultaneously obtained. The present invention has been completed based on the above findings as a result of repeated investigation.

The object of the present invention is achieved by the following means.

<1> An organic semiconductor element comprising:

an organic semiconductor film that includes a polymer having a repeating unit represented by the following Formula (1),

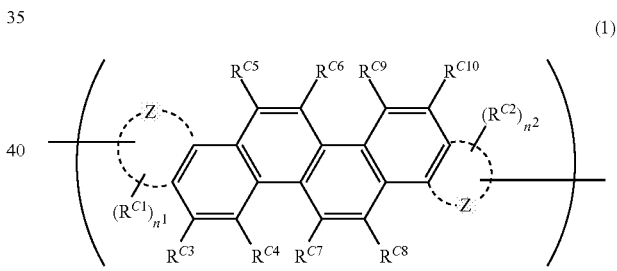

(1)

in Formula (1),

Z's each independently represent a 5-membered aromatic heterocycle, in a case where a nitrogen atom having a $SP^3$ hybrid orbital is included as a ring-constituting atom, the nitrogen atom has an alkyl group, an alkynyl group, an aromatic hydrocarbon group, or an aromatic heterocyclic group, $R^{C1}$ and $R^{C2}$ each independently represent a halogen atom, an alkyl group, an alkenyl group, an alkynyl group, an aromatic hydrocarbon group, or an aromatic heterocyclic group, $n^1$ and $n^2$ each independently represent 0 or 1, and $R^{C3}$ to $R^{C10}$ each independently represent a hydrogen atom, a halogen atom, an alkyl group, an alkenyl group, an alkynyl group, an aromatic hydrocarbon group, or an aromatic heterocyclic group.

<2> The organic semiconductor element according to <1>,
in which the repeating unit is represented by the following Formula (2) or (3),

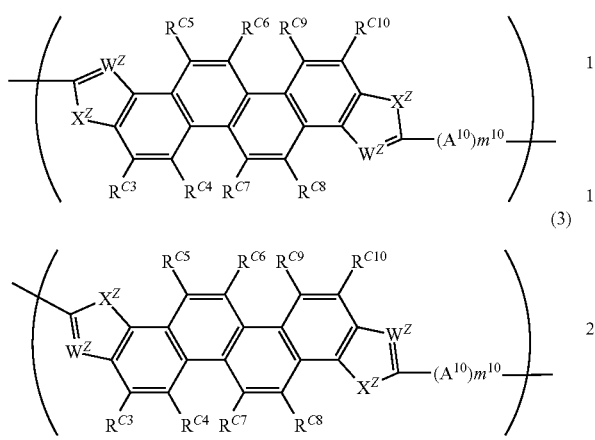

in Formula (2) or (3),
$X^Z$'s each independently represent a chalcogen atom,
$W^Z$'s each independently represent a nitrogen atom or $CR^W$,
$R^W$ represents a hydrogen atom or a substituent,
$R_{C3}$ to $R^{C10}$ have the same definitions as $R_{C3}$ to $R^{C10}$ in Formula (1),
$A^{10}$ represents an aromatic hydrocarbon group, an aromatic heterocyclic group, a vinylene group, or an ethynylene group, and
$m^{10}$ represents an integer of 0 to 12.

<3> The organic semiconductor element according to <1> or <2>, in which the repeating unit is represented by the following Formula (4) or (5),

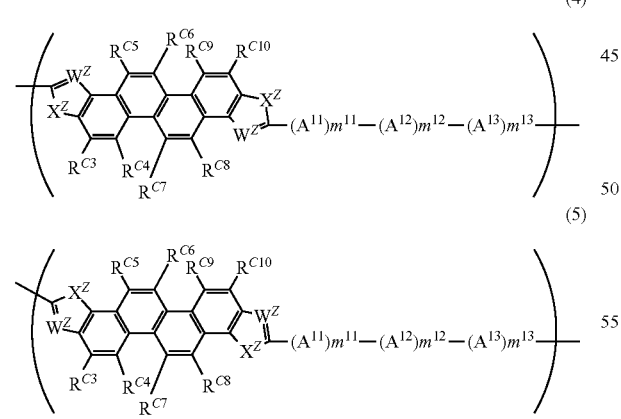

in Formula (4) or (5),
$X^Z$'s each independently represent a chalcogen atom,
$W^Z$'s each independently represent a nitrogen atom or $CR^W$,
$R^W$ represents a hydrogen atom or a substituent,
$R^{C3}$ to $R^{C10}$ have the same definitions as $R^{C3}$ to $R^{C10}$ in Formula (1), $A^{11}$ and $A^{13}$ each independently represent an aromatic hydrocarbon group, an aromatic heterocyclic group other than aromatic heterocyclic groups represented by the following Formulae (A-1) to (A-12), a vinylene group, or an ethynylene group,
$A^{12}$ represents an aromatic heterocyclic group represented by any one of the following Formulae (A-1) to (A-12),
$m^{11}$ and $m^{13}$ each independently represent an integer of 0 to 4, and
$m^{12}$ represents an integer of 0 to 4,

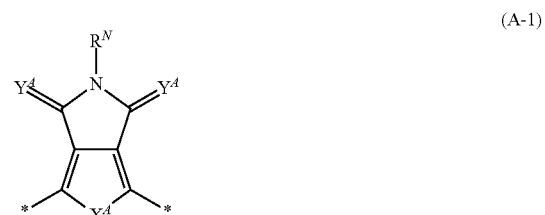

(A-1)

(A-2)

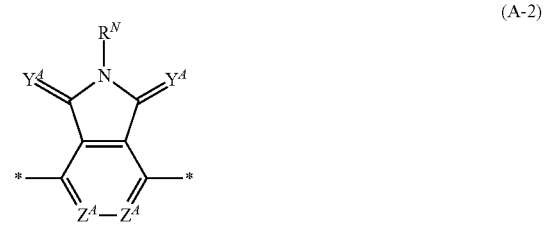

(A-3)

(A-4)

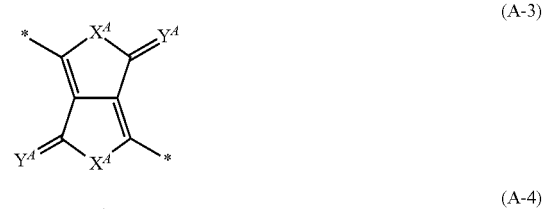

(A-5)

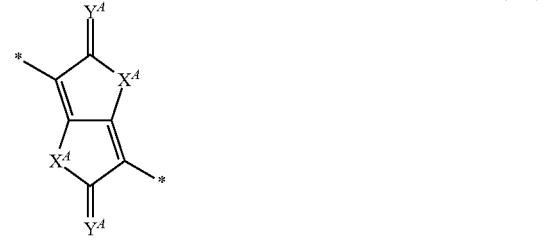

(A-6)

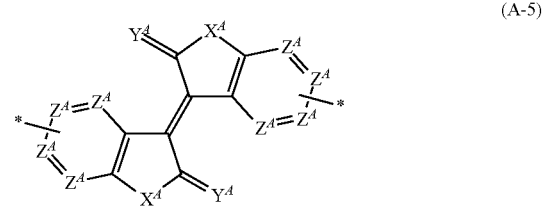

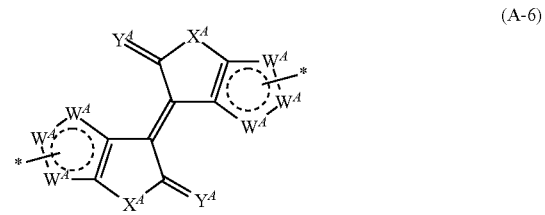

-continued

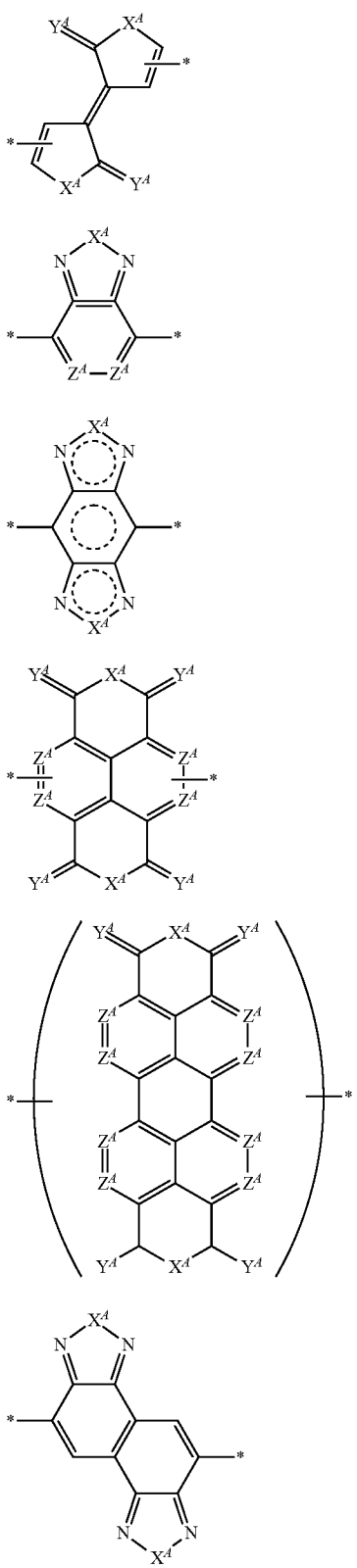

in Formulae (A-1) to (A-12), $X^A$'s each independently represent an oxygen atom, a sulfur atom, a selenium atom, or $NR^X$, $R^N$ and $R^X$ each independently represent an alkyl group which may have at least one of —O—, —S—, or —$NR^A$— in a carbon chain or a group represented by the following Formula (1-1), $Y^A$'s each independently represent an oxygen atom or a sulfur atom, $Z^A$'s each independently represent $CR^{A2}$ or a nitrogen atom, $W^A$'s each independently represent $C(R^{A2})_2$, $NR^{A1}$, a nitrogen atom, $CR^{A2}$, an oxygen atom, a sulfur atom, or a selenium atom, $R^{A1}$'s each independently represent an alkyl group which may have at least one of —O—, —S—, or —$NR^{A3}$— in a carbon chain, a group represented by the following Formula (1-1), or a single bond, $R^{A2}$'s each independently represent a hydrogen atom, a halogen atom, an alkyl group which may have at least one of —O—, —S—, or —$NR^{A3}$— in a carbon chain, or a single bond, $R^A$'s each independently represent a hydrogen atom or a substituent, and

* represents a binding site to another group forming the repeating unit, and

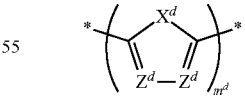 (1-1)

in Formula (1-1), $L_a$ represents an alkylene group having 1 to 20 carbon atoms which may have at least one of —O—, —S—, or —$NR^{1S}$— in a carbon chain, Ar represents an aromatic heterocyclic group or an aromatic hydrocarbon group having 6 to 18 carbon atoms, $L_b$ represents an alkyl group having 1 to 100 carbon atoms which may have at least one of —O—, —S—, or —$NR^{2S}$— in a carbon chain, $R^{1S}$ and $R^{2S}$ each independently represent a hydrogen atom or a substituent, l represents an integer of 1 to 5, and

* represents a binding site to a ring-constituting nitrogen atom in Formula (A-1) or (A-2), a nitrogen atom in $NR^X$ of $X^A$, or a nitrogen atom in $NR^{A1}$ of $W^A$.

<4> The organic semiconductor element according to <3>,
in which the sum of $m^{11}$, $m^{12}$, and $m^{13}$ is 1 or more.

<5> The organic semiconductor element according to <3> or <4>,
in which $m^{12}$ represents an integer of 1 to 4.

<6> The organic semiconductor element according to anyone of <3> to <5>, in which -$(A^{11})m^{11}$- and -$(A^{13})m^{13}$- are each independently represented by the following Formula (Ar-1), $$\text{(Ar-1)}$$

in Formula (Ar-1), $X^d$ represents an oxygen atom, a sulfur atom, a selenium atom, or $NR^{D1}$, $Z^d$'s each independently represent a nitrogen atom or $CR^{D2}$, $R^{D1}$ and $R^{D2}$ represent a hydrogen atom or a substituent, $m^d$ represents an integer of 1 to 4, and

* represents a binding site to another group forming the repeating unit.

<7> The organic semiconductor element according to any one of <2> to <6>,
in which $X^Z$ represents an oxygen atom, a sulfur atom, or a selenium atom, and in a case where $X^Z$ represents a selenium atom, W represents $CR^W$.

<8> The organic semiconductor element according to <6> or <7>,
in which $X^d$ represents a sulfur atom, and
all the Z's represent $CR^{D2}$.

<9> The organic semiconductor element according to anyone of <1> to <8>,
in which the organic semiconductor element is an organic thin film transistor element.

<10> A polymer comprising:
a repeating unit represented by the following Formula (1),

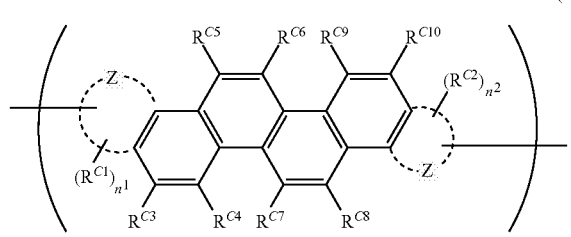

(1)

in Formula (1),
Z's each independently represent a 5-membered aromatic heterocycle,
in a case where a nitrogen atom having a $SP^3$ hybrid orbital is included as a ring-constituting atom, the nitrogen atom has an alkyl group, an alkynyl group, an aromatic hydrocarbon group, or an aromatic heterocyclic group, $R^{C1}$ and $R^{C2}$ each independently represent a halogen atom, an alkyl group, an alkenyl group, an alkynyl group, an aromatic hydrocarbon group, or an aromatic heterocyclic group,
$n^1$ and $n^2$ each independently represent 0 or 1, and
$R^{C3}$ to $R^{C10}$ each independently represent a hydrogen atom, a halogen atom, an alkyl group, an alkenyl group, an alkynyl group, an aromatic hydrocarbon group, or an aromatic heterocyclic group.

<11> The polymer according to <10>,
in which the repeating unit is represented by the following Formula (2) or (3),

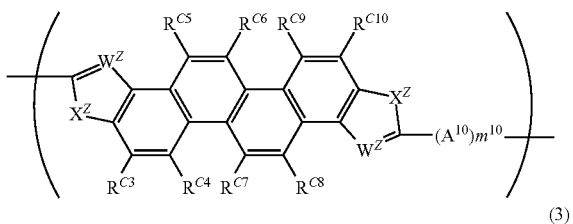

(2)

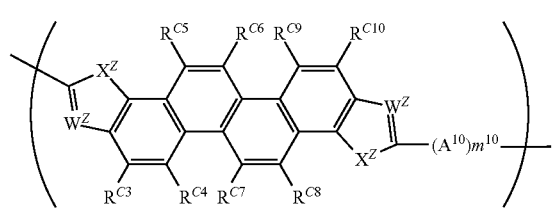

(3)

in Formula (2) or (3),
$X^Z$'s each independently represent a chalcogen atom,
$W^Z$'s each independently represent a nitrogen atom or $CR^W$,
$R^W$ represents a hydrogen atom or a substituent,
$R^{C3}$ to $R^{C10}$ have the same definitions as $R^{C3}$ to $R^{C10}$ in Formula (1),
$A^{10}$ represents an aromatic hydrocarbon group, an aromatic heterocyclic group, a vinylene group, or an ethynylene group, and
$m^{10}$ represents an integer of 0 to 12.

<12> The polymer according to <10> or <11>,
in which the repeating unit is represented by the following Formula (4) or (5),

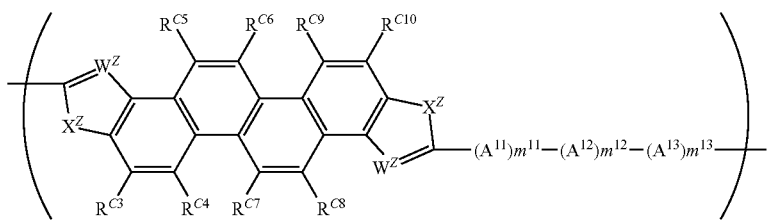

(4)

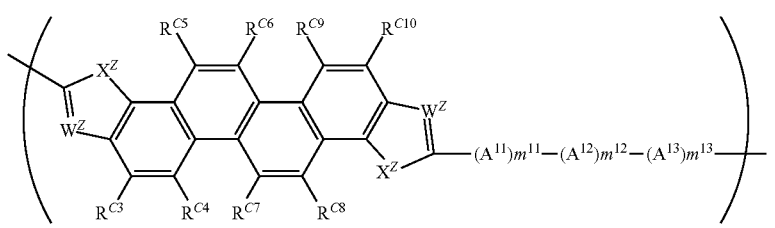

(5)

in Formula (4) or (5),
$X^Z$s each independently represent a chalcogen atom,
$W^Z$'s each independently represent a nitrogen atom or $CR^W$,
$R^W$ represents a hydrogen atom or a substituent,
$R^{C3}$ to $R^{C10}$ have the same definitions as $R^{C3}$ to $R^{C10}$ in Formula (1),
$A^{11}$ and $A^{13}$ each independently represent an aromatic hydrocarbon group, an aromatic heterocyclic group other than aromatic heterocyclic groups represented by the following Formulae (A-1) to (A-12), a vinylene group, or an ethynylene group, $A^{12}$ represents an aromatic heterocyclic group represented by any one of the following Formulae (A-1) to (A-12), $m^{11}$ and $m^{13}$ each independently represent an integer of 0 to 4, and $m^{12}$ represents an integer of 0 to 4,

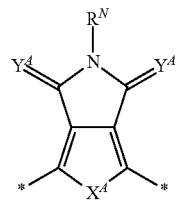
(A-1)

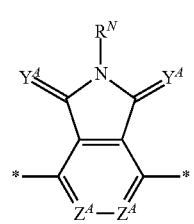
(A-2)

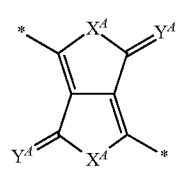
(A-3)

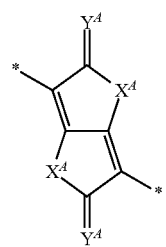
(A-4)

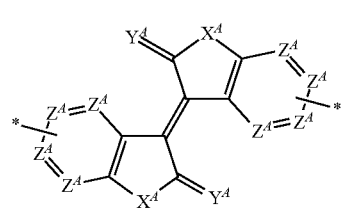
(A-5)

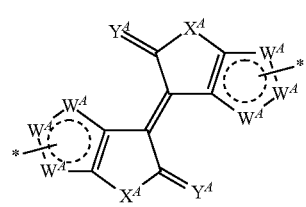
(A-6)

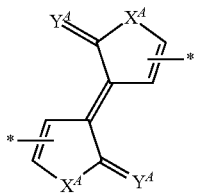
(A-7)

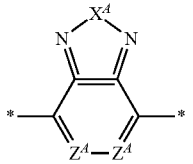
(A-8)

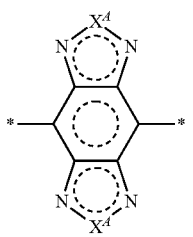
(A-9)

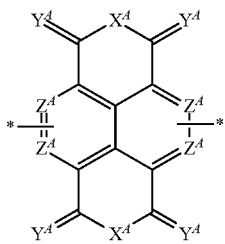
(A-10)

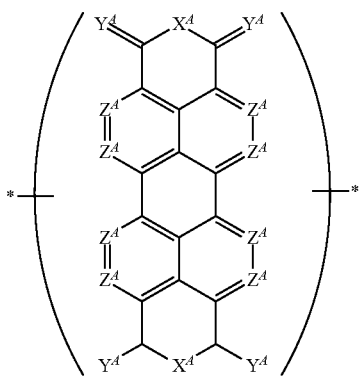
(A-11)

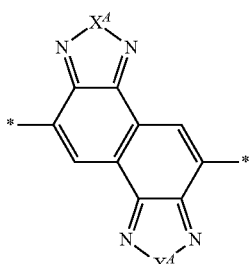
(A-12)

in Formulae (A-1) to (A-12), $X^A$'s each independently represent an oxygen atom, a sulfur atom, a selenium atom, or $NR^X$, $R^N$ and $R^X$ each independently represent an alkyl group which may have at least one of —O—, —S—, or —NR$^{A3}$— in a carbon chain or a group represented by the following Formula (1-1), $Y^A$'s each independently represent an oxygen atom or a sulfur atom, $Z^A$'s each independently represent CR$^{A2}$ or a nitrogen atom, $W^A$'s each independently represent C(R$^{A2}$)$_2$, NR$^{A1}$, a nitrogen atom, CR$^{A2}$, an oxygen atom, a sulfur atom, or a selenium atom, $R^{A1}$'s each independently represent an alkyl group which may have at least one of —O—, —S—, or —NR$^{A3}$— in a carbon chain, a group represented by the following Formula (1-1), or a single bond, $R^{A2}$'s each independently represent a hydrogen atom, a halogen atom, an alkyl group which may have at least one of —O—, —S—, or —NR$^{A3}$— in a carbon chain, or a single bond, $R^{A3}$'s each independently represent a hydrogen atom or a substituent, and

* represents a binding site to another group forming the repeating unit, and

  (1-1)

in Formula (1-1), $L_a$ represents an alkylene group having 1 to 20 carbon atoms which may have at least one of —O—, —S—, or —NR$^{1S}$— in a carbon chain, Ar represents an aromatic heterocyclic group or an aromatic hydrocarbon group having 6 to 18 carbon atoms, $L_b$ represents an alkyl group having 1 to 100 carbon atoms which may have at least one of —O—, —S—, or —NR$^{2S}$— in a carbon chain, $R^{1S}$ and $R^{2S}$ each independently represent a hydrogen atom or a substituent, l represents an integer of 1 to 5, and

* represents a binding site to a ring-constituting nitrogen atom in Formula (A-1) or (A-2), a nitrogen atom in NR$^X$ of $X^A$, or a nitrogen atom in NR$^{A1}$ of W$^A$.

<13> The polymer according to <12>,
in which the sum of m$^{11}$, m$^{12}$, and m$^{13}$ is 1 or more.

<14> The polymer according to <12> or <13>,
in which m$^{12}$ represents an integer of 1 to 4.

<15> The polymer according to anyone of <12> to <14>,
in which -(A$^{11}$)m$^{11}$- and -(A$^{13}$)m$^{13}$- are each independently represented by the following Formula (Ar-1),

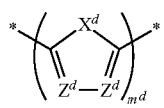  (Ar-1)

in Formula (Ar-1), $X^d$ represents an oxygen atom, a sulfur atom, a selenium atom, or NR$^{D1}$, $Z^d$'s each independently represent a nitrogen atom or CR$^{D2}$, $R^{D1}$ and $R^{D2}$ represent a hydrogen atom or a substituent, m$^d$ represents an integer of 1 to 4, and

* represents a binding site to another group forming the repeating unit.

<16> The polymer according to anyone of <11> to <15>,
in which $X^Z$ represents an oxygen atom, a sulfur atom, or a selenium atom, and in a case where $X^Z$ represents a selenium atom, $W^Z$ represents CR$^W$.

<17> The polymer according to <15> or <16>,
in which $X^d$ represents a sulfur atom, and
all the $Z^d$'s represent CR$^{D2}$.

<18> An organic semiconductor composition comprising:
the polymer according to any one of <10> to <17>; and
a solvent.

<19> An organic semiconductor film comprising:
the polymer according to any one of <10> to <17>.

The present invention can provide an organic semiconductor element having high carrier mobility and high heat resistance. In addition, the present invention can provide a polymer used in the organic semiconductor element having the excellent characteristics, and an organic semiconductor composition and an organic semiconductor film including the polymer.

The above-described and other characteristics and advantageous effects of the present invention will be clarified from the following description appropriately with reference to the accompanying drawings.

DESCRIPTION OF THE PREFERRED EMBODIMENTS

Figure 1:
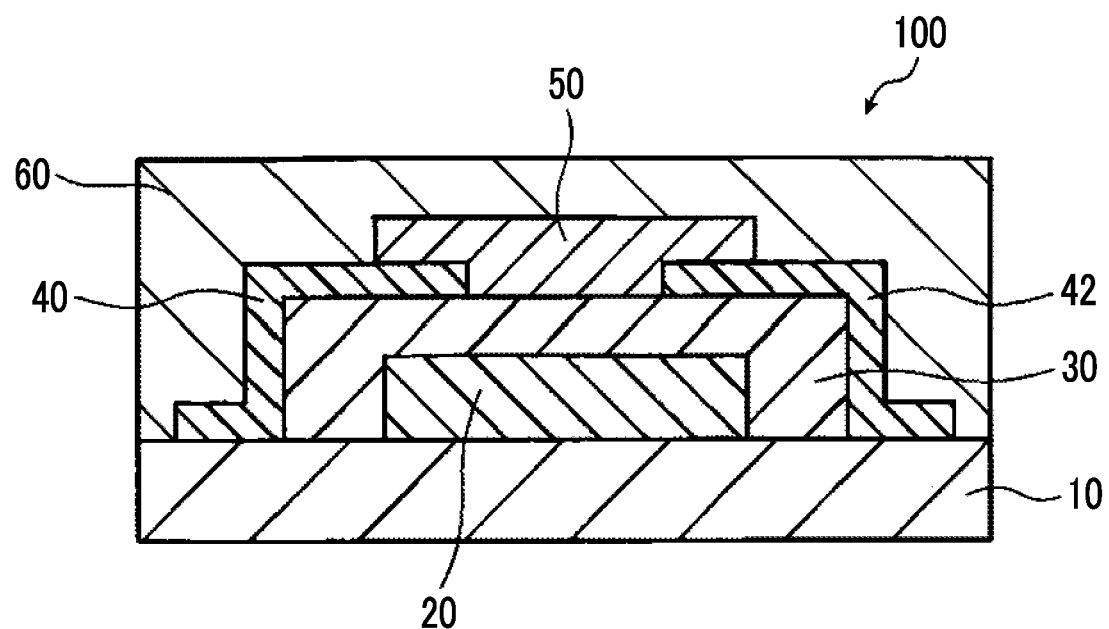
FIG. 1 is a schematic cross-sectional view showing a bottom gate-bottom contact type organic thin film transistor element as an example of a semiconductor element according to an embodiment of the present invention.

In this specification, numerical ranges represented by "to" include numerical values before and after "to" as lower limit values and upper limit values.

The meaning of compounds described in this specification include not only the compounds themselves but also salts and ions thereof. In addition, within a range where a desired effect does not deteriorate, a part of the structure may be changed.

In addition, in a case where it is not clearly described that a compound is substituted or unsubstituted, this compound has any substituent within a range where a desired effect does not deteriorate. The same shall be applied to a substituent, a linking group, or the like (hereinafter, referred to as "substituent or the like").

In this specification, in a case where a plurality of substituents or the like represented by a specific reference numeral are present or a plurality of substituents or the like are simultaneously defined, the respective substituents or the like may be the same as or different from each other unless specified otherwise. The same shall be applied to definition of the number of substituents or the like. In addition, in a case where a plurality of substituents or the like are close to (in particular, adjacent to) each other, the substituents or the like may be linked to each other to form a ring unless specified otherwise.

In the present invention, in a case where a plurality of repeating units represented by the same chemical structure are present in a polymer, the respective repeating units present in the polymer may be the same as or different from each other. The same shall be applied to each group forming the repeating unit.

In addition, in a case where the number of carbon atoms in a group is limited, the number of carbon atoms in this group represents the total number of carbon atoms including substituents unless specified otherwise.

In the present invention, in a case where a group can form an acyclic skeleton and a cyclic skeleton, this group includes a group having an acyclic skeleton and a group having a cyclic skeleton unless specified otherwise. For example, an alkyl group includes a linear alkyl group, a branched alkyl group, and a cycloalkyl group. In a case where a group can form a cyclic skeleton, the lower limit of the number of atoms of the group forming a cyclic skeleton is not limited to the lower limit of the number of atoms specifically described regarding this group, and is 3 or more and preferably 5 or more.

A preferable embodiment of the present invention will be described below, but the present invention is not limited thereto.

[Polymer]

First, a polymer according to the embodiment of the present invention will be described.

The polymer (organic semiconductor) according to the embodiment of the present invention includes a repeating unit represented by the following Formula (1). As shown in Formula (1), this repeating unit may include a chrysene fused ring group in which a 5-membered aromatic heterocycle represented by Z is fused to each of benzene rings (carbon atoms in the 1-position and the 2-position and carbon atoms in the 7-position and the 8-position) at both terminals of a chrysene ring structure, and may further include a divalent conjugated group that is copolymerizable with this chrysene fused ring group. In the present invention, the position numbers of ring-constituting carbon atoms of the chrysene ring will be described below.

It is preferable that the polymer according to the embodiment of the present invention is a copolymer including a repeating unit having the chrysene fused ring group and the conjugated group. The details of the conjugated group will be described below, and the copolymer is preferably a π-conjugated polymer.

In a case where the polymer according to the embodiment of the present invention has an aromatic heterocyclic group represented by $A^{12}$ in Formula (4) or (5) shown below as the conjugated group, the polymer may also be a so-called "D-A polymer" including an electron-donating unit (donor unit) and an electron-accepting unit (acceptor unit). In this case, the chrysene fused ring group functions as the donor unit, and the aromatic heterocyclic group represented by $A^{12}$ functions as the acceptor unit. In a case where the polymer according to the embodiment of the present invention has a group represented by $A^{11}$ or $A^{13}$ in Formula (4) or (5) shown below, these groups function as the donor unit.

In Formula (1), Z represents a 5-membered aromatic heterocycle. The aromatic heterocycle may be a monocyclic group or a fused ring group composed of 2 or more rings as long as it is a 5-membered ring group. It is preferable that the aromatic heterocycle is a monocyclic group. Examples of a ring-constituting heteroatom included in the aromatic heterocyclic group include a chalcogen atom (for example, an oxygen atom, a sulfur atom, a selenium atom, or a tellurium atom), a nitrogen atom, and a silicon atom. Among these, a chalcogen atom or a nitrogen atom is preferable, a chalcogen atom is more preferable, an oxygen atom or a sulfur atom is still more preferable, and a sulfur atom is even still more preferable. The number of ring-constituting heteroatoms is not particularly limited and is preferably 1 to 4, more preferably 1 or 2, and still more preferably 1.

The aromatic heterocycle forming the aromatic heterocyclic group is not particularly limited, and examples thereof include a furan ring, a thiophene ring, a selenophene ring, a pyrrole ring, a silole ring, an oxazole ring, a thiazole ring, a selenoazole ring, an imidazole ring, an oxadiazole ring, a thiadiazole ring, a selenodiazole ring, and a triazole ring.

Among these, a furan ring, a thiophene ring, a selenophene ring, a pyrrole ring, an oxazole ring, a thiazole ring, or an imidazole ring, is preferable, a furan ring, a thiophene ring, a selenophene ring, an oxazole ring, or a thiazole ring is more preferable, a furan ring, a thiophene ring, or a selenophene ring, is still more preferable, and a thiophene ring is even still more preferable.

In Formula (1), two Z's may represent the same ring or different rings and preferably represent the same ring.

An aspect where Z is fused to the chrysene ring is not particularly limited. For example, the chrysene ring may be fused to any ring-constituting atom constituting the Z ring and is preferably fused to the α-position (adjacent position) or the β-position (position opposite to the ring-constituting heteroatom and adjacent to the α-position) with respect to the ring-constituting heteroatom. In addition, an orientation of the Z ring (position of the ring-constituting heteroatom) is not particularly limited, and examples thereof include an orientation represented by formula (2) or (3) shown below.

In a case where the aromatic heterocycle has a nitrogen atom having a SP³ hybrid orbital as the ring-constituting atom (has a —$NR^{ZN}$— group), the nitrogen atom has an alkyl group, an alkynyl group, an aromatic hydrocarbon group, or an aromatic heterocyclic group.

In a case where the nitrogen atom has the above-described group, the carrier mobility and heat resistance are excellent.

Examples of the alkyl group which may be included in the nitrogen atom (may be used as $R^{ZN}$) include a linear alkyl group, a branched alkyl group, and a cyclic alkyl group. In the case of the linear alkyl group or the branched alkyl group, the number of carbon atoms is preferably 1 to 35, more preferably 1 to 20, and still more preferably 1 to 12. In the case of the cyclic alkyl group, the number of carbon atoms, is preferably 3 to 35, more preferably 3 to 25, and still more preferably 3 to 20.

The alkynyl group which may be included in the nitrogen atom is not particularly limited, and is preferably an alkynyl group having 2 to 30 carbon atoms, more preferably an alkynyl group having 2 to 15 carbon atoms, and still more preferably an alkynyl group having 3 to 12 carbon atoms.

The aromatic hydrocarbon group which may be included in the nitrogen atom may be a monocyclic group or a fused ring group composed of 2 or more rings. The aromatic hydrocarbon group is preferably an aromatic hydrocarbon group having 6 to 20 carbon atoms and more preferably an aromatic hydrocarbon group having 6 to 18 carbon atoms.

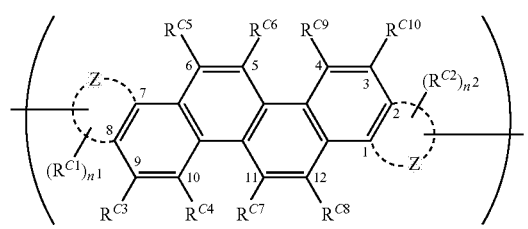

(1)

The aromatic heterocyclic group which may be included in the nitrogen atom may be a monocyclic group or a fused ring group composed of 2 or more rings. It is preferable that the aromatic heterocyclic group has the same definition as the aromatic heterocycle of Z.

Each group ($R^{ZN}$) which may be included in the nitrogen atom may further have a substituent. The substituent is not particularly limited, and examples thereof include an alkyl group, an alkenyl group, an alkynyl group, an alkoxy group, an aromatic heterocyclic group, and a silyl group (preferably a trialkylsilyl group).

As the group which has the substituent, for example, a trialkylsilylethynyl group (in which the number of atoms in the alkyl group is preferably 1 to 30 carbon atoms) is used.

In Formula (1), $R^{C1}$ and $R^{C2}$ each independently represent a halogen atom, an alkyl group, an alkenyl group, an alkynyl group, an aromatic hydrocarbon group, or an aromatic heterocyclic group. Among these, an alkyl group, an aromatic hydrocarbon group, or an aromatic heterocyclic group, is preferable, and an alkyl group is more preferable.

The halogen atom which may be used as $R^{C1}$ and $R^{C2}$ is preferably a fluorine atom, a chlorine atom, a bromine atom, or an iodine atom, more preferably a fluorine atom or a chlorine atom, and still more preferably a fluorine atom.

Examples of the alkyl group which may be used as $R^{C1}$ and $R^{C2}$ include an alkyl group which may have at least one of —O—, —S—, or —$NR^1$— in a carbon chain.

In the present invention, examples of the alkyl group having —O— in a carbon chain include a group having —O— in the middle of a carbon-carbon bond, a group (also referred to as "alkoxy group") having —O— at a terminal of a carbon-carbon bond, and a group having —O— in the middle of and at a terminal of a carbon-carbon bond. The same shall be applied to the alkyl group having —S— or —$NR^1$— in a carbon chain. In a case where the alkyl group has —O—, —S—, and —$NR^1$—, the total number of these groups is at least one, and the upper limit thereof is not particularly limited and is, for example, 5.

$R^1$ represents a hydrogen atom or a substituent. The substituent which may be used as $R^1$ is not particularly limited and has the same definition as the substituent of $R^{1S}$ and $R^{2S}$ described below.

The alkyl group is preferably an alkyl group having 1 to 35 carbon atoms or an alkyl group having 1 to 35 carbon atoms which has —O— at a terminal of a carbon-carbon bond and more preferably an alkyl group having 1 to 25 carbon atoms.

Examples of the alkenyl group which may be used as $R^{C1}$ and $R^{C2}$ include a linear alkenyl group, a branched alkenyl group, and a cyclic alkenyl group. In the case of the linear alkenyl group and the branched alkenyl group, the number of carbon atoms is preferably 2 to 30, more preferably 2 to 25, and still more preferably 3 to 20. In the case of the cyclic alkenyl group, the number of carbon atoms is preferably 3 to 30, more preferably 3 to 25, and still more preferably 3 to 20.

The alkynyl group, the aromatic hydrocarbon group, and the aromatic heterocyclic group which may be used as $R^{C1}$ and $R^{C2}$ have the same definitions and the same preferable ranges as the alkynyl group, the aromatic hydrocarbon group, and the aromatic heterocyclic group which may be used as $R^{ZN}$.

Each group which may be used as $R^{C1}$ and $R^{C2}$ may further have a substituent.

Examples of the substituent include the respective groups which may be included in the nitrogen atom. In addition, for example, a group including a combination of the groups which may be used as $R^{C1}$ and $R^{C2}$ may also be used. In this case, the number of the combination is not particularly limited and is, for example, preferably 2 to 10 and more preferably 2 to 7. Among these, a group including a combination of an alkyl group and an aromatic hydrocarbon group or an aromatic heterocyclic group is preferable, and a group represented by Formula (1-1) shown below is more preferable.

$R^{C1}$ and $R^{C2}$ may be the same as or different from each other.

$n^1$ and $n^2$ each independently represent 0 or 1 and preferably 0.

$R^{C3}$ to $R^{C10}$ each independently represent a hydrogen atom, a halogen atom, an alkyl group, an alkenyl group, an alkynyl group, an aromatic hydrocarbon group, or an aromatic heterocyclic group. Among these, a hydrogen atom, an alkyl group, an alkynyl group, or an aromatic heterocyclic group is preferable, a hydrogen atom, an alkyl group, or an alkynyl group is more preferable, a hydrogen atom or an alkyl group is still more preferable, and a hydrogen atom is even still more preferable.

The halogen atom, the alkyl group, the alkenyl group, the alkynyl group, the aromatic hydrocarbon group, and the aromatic heterocyclic group which may be used as $R^{C3}$ to $R^{C10}$ have the same definitions and the same preferable ranges as the halogen atom, the alkyl group, the alkenyl group, the alkynyl group, the aromatic hydrocarbon group, and the aromatic heterocyclic group which may be used as $R^{C1}$ to $R^{C2}$.

In a case where $R^{C3}$ to $R^{C10}$ represent a substituent, any one of $R^{C3}$, . . . , or $R^{C10}$ may represent a substituent, and it is preferable that any one of $R^{C5}$, . . . , or $R^{C8}$ represents a substituent. It is more preferable that either or both $R^{C5}$ and $R^{C8}$ represent a substituent.

In addition, in a case where adjacent two among $R^{C3}$ to $R^{C10}$ represent a substituent, the two substituents may be bonded to each other to form a ring. However, it is preferable that the two substituents do not form a ring. The ring to be formed is not particularly limited.

In a case where $R^{C3}$ to $R^{C10}$ represent a substituent, this substituent may further have a substituent. The substituent which may be further included is not particularly limited, and examples thereof include the respective groups which may be included in the nitrogen atom and a group including a combination of the substituents which may be used as $R^{C3}$ to $R^{C10}$. The group including a combination of the substituents which may be used as $R^{C3}$ to $R^{C10}$ has the same definition and the same preferable ranges as the group including a combination of the groups which may be used as $R^{C1}$ and $R^{C2}$.

Specific examples of $R^{C3}$ to $R^{C10}$ which further have a substituent include the respective groups which may be included in the nitrogen atom. Among these, the trialkylsilylethynyl group is preferable. In addition, for example, a group represented by Formula (1-1) shown below is preferable.

In a case where $R^{C3}$ to $R^{C10}$ represent a substituent, the substituents may be the same as or different from each other.

It is preferable that the repeating unit represented by Formula (1) includes a conjugated group, and it is more preferable that the repeating unit represented by Formula (1) is represented by the following Formula (2) or (3).

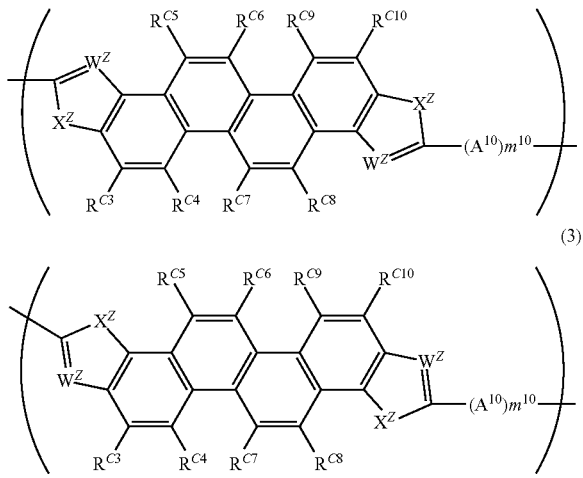

In Formula (2) or (3), $X^Z$ represents a chalcogen atom. Among these, an oxygen atom, a sulfur atom, or a selenium atom is more preferable, and a sulfur atom or a selenium atom is still more preferable.

$W^Z$ represents a nitrogen atom or $CR^W$ and preferably $CR^W$.

$R^W$ represents a hydrogen atom or a substituent and preferably a hydrogen atom. Specific examples of the substituent which may be used as $R^W$ include the respective groups which may be used as $R^{C1}$ and $R^{C2}$, and preferable examples thereof are the same as those of $R^{C1}$ and $R^{C2}$.

Two $X^Z$'s and two $W^Z$'s in each of the formulae may be the same as or different from each other and are preferably the same as each other, respectively.

In each of the formulae, a combination of $X^Z$ and $W^Z$ is not particularly limited, and a combination of an oxygen atom or a sulfur atom (preferably a sulfur atom) as $X^Z$ and a nitrogen atom or $CR^W$ (preferably $CR^W$) as $W^Z$, or a combination of a selenium atom as X and $CR^W$ as $W^Z$ is preferable.

$R^{C3}$ to $R^{C10}$ each independently have the same definitions and the same preferable ranges as $R^{C3}$ to $R^{C10}$ in Formula (1).

$A^{10}$ represents an aromatic hydrocarbon group, an aromatic heterocyclic group, a vinylene group, or an ethynylene group, and preferably an aromatic hydrocarbon group or an aromatic heterocyclic group.

The aromatic hydrocarbon group which may be used as $A^{10}$ is not particularly limited and may be a monocyclic group or a fused ring group composed of 2 or more rings. From the viewpoints of carrier mobility and heat resistance, it is preferable that the aromatic hydrocarbon group is a monocyclic group. As the aromatic hydrocarbon group, an aromatic hydrocarbon group having 6 to 20 carbon atoms is preferable, an aromatic hydrocarbon group having 6 to 18 carbon atoms is more preferable, and a phenylene group, a naphthylene group, or a group obtained by removing two hydrogen atoms from an aromatic hydrocarbon in which three rings or four rings are fused is still more preferable. Examples of the group obtained by removing two hydrogen atoms from an aromatic hydrocarbon in which three rings or four rings are fused include a group obtained by removing two hydrogen atoms from a fluorene ring group, an anthracene ring, a phenanthrene ring, a chrysene ring, or a pyrene ring.

As the aromatic hydrocarbon group, a phenylene group, a naphthylene group, a fluorene ring, or a pyrene ring group is preferable, and a phenylene group or a naphthylene group is more preferable.

The aromatic heterocyclic group which may be used as $A^{10}$ is not particularly limited and may be a monocyclic group or a fused ring group composed of 2 or more rings. In addition, the aromatic heterocyclic group may be a group in which monocyclic or fused heterocyclic groups are linked through a carbon-carbon double bond. In a case where the aromatic heterocyclic group is a monocyclic group, it is preferable that the number of ring members is 5 to 7. In addition, as the ring-constituting heteroatom included in the aromatic heterocyclic group, a nitrogen atom, an oxygen atom, a sulfur atom, or a selenium atom is preferable, and a sulfur atom is more preferable.

Examples of the aromatic heterocyclic group include aromatic heterocyclic groups represented by Formulae (A-1) to (A-12) shown below and an aromatic heterocyclic group other than the aromatic heterocyclic groups represented by Formulae (A-1) to (A-12) shown below.

Examples of the aromatic heterocycle which forms the aromatic heterocyclic group other than the aromatic heterocyclic groups represented by Formulae (A-1) to (A-12) include a monocycle such as a furan ring, a thiophene ring, a selenophene ring, a pyrrole ring, an oxazole ring, a thiazole ring, a selenoazole group, an imidazole ring, an oxadiazole ring, a thiadiazole ring, a selenodiazole group, a triazole ring, a pyridine ring, or a triazine ring. In addition, for example, a fused ring composed of at least two of the above-described monocycles or a fused ring composed of at least one of the above-described monocycles and at least one benzene ring or cyclopentadiene ring may also be used. The number of rings composing the fused ring is not particularly limited as long as it is 2 or more, and is preferably 2 to 6. Specific examples of the aromatic heterocycle include a benzodithiophene ring, a dithiophene ring, a trithiophene ring, and a cyclopentadithiophene ring.

As the aromatic heterocyclic group other than the aromatic heterocyclic groups represented by Formulae (A-1) to (A-12) shown below, a group represented by Formula (Ar-1) shown below is preferable, a furan ring group, a thiophene ring group, or a selenophene ring group is more preferable, and a thiophene ring is still more preferable.

The aromatic hydrocarbon group and the aromatic heterocyclic group each independently may have a substituent. A preferable substituent is not particularly limited, and examples thereof include an alkyl group which may have at least one of —O—, —S—, or —NR$^1$— in a carbon chain (for example, preferably an alkyl group having 1 to 35 carbon atoms or an alkoxy group having 1 to 35 carbon atoms and more preferably an alkyl group having 1 to 25 carbon atoms), an alkenyl group (preferably having 2 to 30 carbon atoms), an alkynyl group (preferably having 2 to 30 carbon atoms), an aromatic hydrocarbon group (having preferably 6 to 30 carbon atoms), an aromatic heterocyclic group (preferably a 5-membered to 7-membered ring; including preferably at least one of an oxygen atom, a nitrogen atom, a sulfur atom, or a selenium atom as a ring-constituting heteroatom), a halogen atom (preferably a fluorine atom, a chlorine atom, a bromine atom, or an iodine atom, more preferably a fluorine atom or a chlorine atom, and still more preferably a fluorine atom), and a group represented by Formula (1-1) shown below. Among these, the alkyl group is preferable.

$R^1$ is as described above.

The vinylene group which may be used as $A^{10}$ may have a substituent and preferably does not have a substituent. The substituent which may be included in the vinylene group has the same definition and the same preferable ranges as the substituent which may be included in the aromatic hydrocarbon group and the aromatic heterocyclic group which may be used as $A^{10}$.

$m^{10}$ represents an integer of 0 to 12, preferably an integer of 1 to 12, more preferably an integer of 1 to 10, still more preferably an integer of 1 to 8, even still more preferably an integer of 1 to 5, and most preferably an integer of 1 to 3.

In a case where $m^{10}$ represents an integer of 2 or more, a plurality of $A^{10}$'s may be the same as or different from each other.

In this case, a combination of $A^{10}$'s which may be used in $-(A^{10})m^{10}-$ is not particularly limited, and the respective groups may be appropriately selected and combined. For example, an aspect including at least one (preferably 1 to 4) aromatic heterocyclic group represented by any one of Formulae (A-1) to (A-12) shown below is preferable, and an aspect including an aromatic hydrocarbon group and at least one (preferably 2 or more, more preferably 2 to 8, and still more preferably 2 to 6) aromatic heterocyclic group other than the aromatic heterocyclic groups represented by Formulae (A-1) to (A-12) shown below is more preferable.

It is more preferable that the repeating unit represented by Formula (1) is represented by the following Formula (4) or (5).

$X^Z$, $W^Z$, and $R^{C3}$ to $R^{C10}$ in Formula (4) and Formula (5) have the same definitions and the same preferable ranges as $X^Z$, $W^Z$, and $R^{C3}$ to $R^{C10}$ in Formula (2) or Formula (3).

$A^{12}$ represents an aromatic heterocyclic group represented by any one of the following Formulae (A-1) to (A-12). In each of the following formulae, * represents a binding site to another group forming the repeating unit represented by Formula (4) or Formula (5).

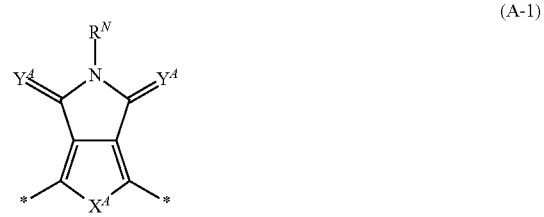

(A-1)

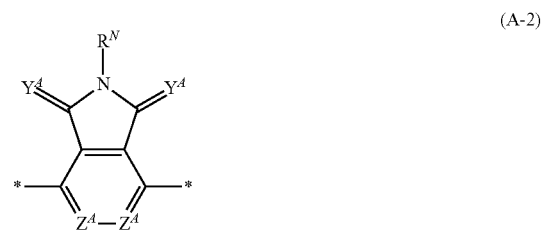

(A-2)

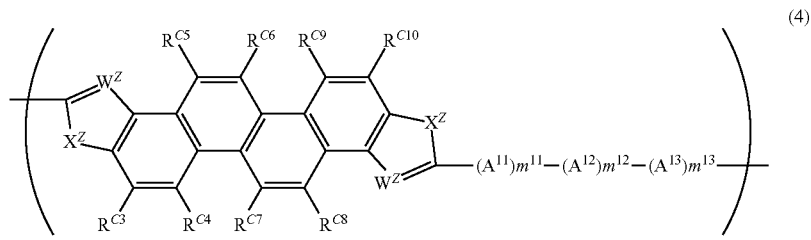

(4)

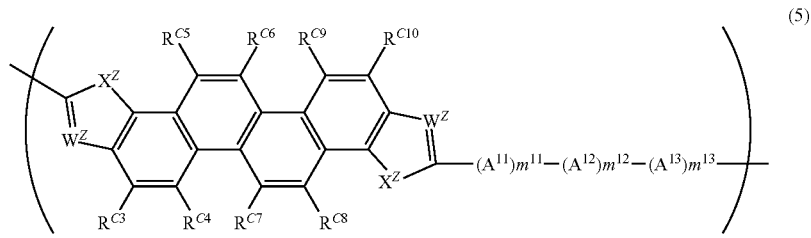

(5)

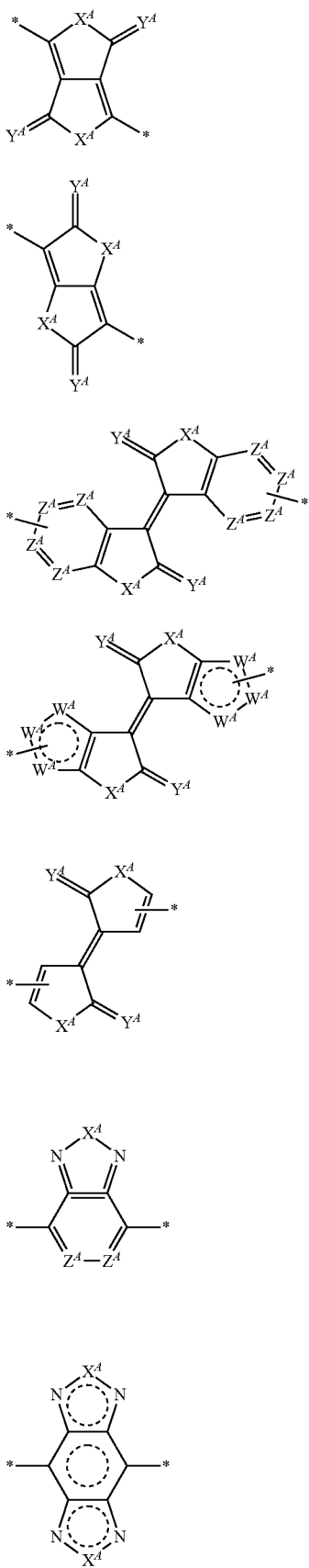

(A-3)
(A-4)
(A-5)
(A-6)
(A-7)
(A-8)
(A-9)

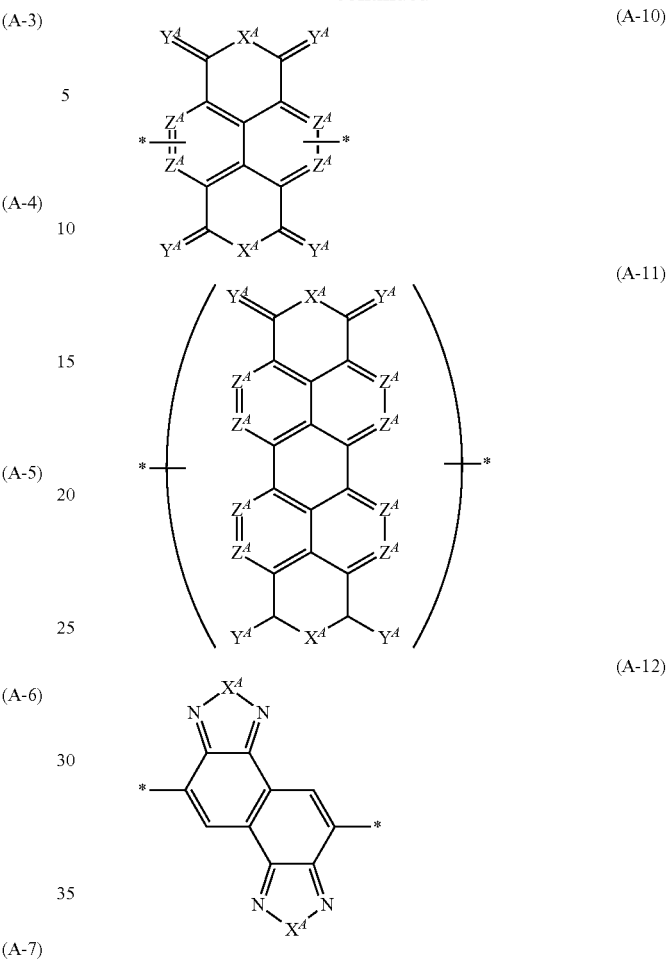

(A-10)
(A-11)
(A-12)

In Formula (A-6) and Formula (A-9), a round broken line in a 5-membered ring or a 6-membered ring represent an aromatic ring in the 5-membered ring or the 6-membered ring.

In Formulae (A-1) to (A-12), $X^A$'s each independently represent an oxygen atom, a sulfur atom, a selenium atom, or $NR^X$, and preferably a sulfur atom or $NR^X$.

$R^N$ and $R^X$ each independently represent an alkyl group which may have at least one of —O—, —S—, or —$NR^{A3}$— in a carbon chain or a group represented by Formula (1-1) shown below. The alkyl group which may be used as $R^N$ and $R^X$ has the same definition and the same preferable ranges as the alkyl group which may be used as $R^{A1}$ described below. $R^{A3}$ will be described below.

$Y^A$'s each independently represent an oxygen atom or a sulfur atom and preferably an oxygen atom.

$Z^A$'s each independently represent $CR^{A2}$ or a nitrogen atom and preferably $CR^{A2}$.

$R^{A2}$'s each independently represent a hydrogen atom, a halogen atom, an alkyl group which may have at least one of —O—, —S—, or —$NR^{A3}$— in a carbon chain, or a single bond. It is preferable that $R^{A2}$ represents a hydrogen atom or a single bond. In Formula (A-2) and Formula (A-8), $R^{A2}$ does not represent a single bond. In a case where $R^{A2}$ represents a halogen atom, as the halogen atom, a fluorine atom, a chlorine atom, a chlorine atom, a bromine atom, or an iodine atom is preferable, and a fluorine atom is more preferable. The alkyl group which may be used as $R^{A2}$ has the same definition and the same preferable ranges as the alkyl group which may be used as $R^{A1}$ described below. $R^{A3}$ will be described below.

In a case where $R^{A2}$ in $CR^{A2}$ represents a single bond, a C atom in $CR^{A2}$ is a binding site (in each of the formulae, represented by *) in (A-5), (A-10), and (A-11).

Specifically, in each of two ring structures including $Z^A$ in Formula (A-5) and Formula (A-10), one $Z^A$ represents $CR^{A2}$, in which $R^{A2}$ represents a single bond. $CR^{A2}$ (carbon atom) including a single bond represents a binding site represented by * in each of the formulae. In addition, in Formula (A-1), two of eight $Z^A$'s represent $CR^{A2}$, in which $R^{A2}$ represent a single bond. The two $CR^{A2}$'s (carbon atom) including a single bond represent a binding site represented by * in Formula (A-1).

In the repeating unit represented by Formula (4) or Formula (5), the binding site refers to a binding site to another group forming the repeating unit represented by Formula (4) or Formula (5). The other group refers to the chrysene fused ring group or a group represented by $A^{11}$, $A^{12}$, or $A^{13}$ in the repeating unit represented by Formula (4) or Formula (5).

$W^A$'s each independently represent $C(R^{A2})_2$, $NR^{A1}$, a nitrogen atom, $CR^{A2}$, an oxygen atom, a sulfur atom, or a selenium atom, preferably $C(R^{A2})_2$, $CR^{A2}$, or a sulfur atom, and more preferably $CR^{A2}$ or a sulfur atom.

$R^{A1}$'s each independently represent an alkyl group which may have at least one of —O—, —S—, or —NR$^{A3}$— in a carbon chain, a group represented by Formula (1-1) shown below, or a single bond. As $R^{A1}$, the alkyl group or the group represented by Formula (1-1) shown below is preferable. The alkyl group which may be used as $R^{A1}$ may be linear or branched. The number of carbon atoms in the alkyl group is preferably 1 to 35 and more preferably 1 to 25.

$R^{A2}$ in $W^A$ has the same definition and the same preferable ranges as $R^{A2}$ in $Z^A$.

$R^{A3}$ represents a hydrogen atom or a substituent. The substituent which may be used as $R^{A3}$ is not particularly limited and has the same definition and the same preferable ranges as the substituent of $R^{1S}$ and $R^{2S}$ described below.

In each of two ring structures including $W^A$ in Formula (A-6), one $W^A$ adopts any one of the following aspects 1 to 3 and preferably the aspect 1.

Aspect 1: $W^A$ represents $CR^{A2}$, in which $R^{A2}$ represents a single bond Aspect 2: $W^A$ represents $NR^{A1}$, in which $R^{A1}$ represents a single bond Aspect 3: $W^A$ represents $C(R^{A2})_2$, in which one $R^{A2}$ represents a single bond and the other $R^{A2}$ represents a hydrogen atom, a halogen atom, or the alkyl group In each of the aspects, $CR^{A2}$ (carbon atom), $NR^{A1}$ (nitrogen atom), or $C(R^{A2})_2$ (carbon atom) including a single bond represents a binding site (in the formula, represented by *) in Formula (A-6).

The aromatic heterocyclic groups represented by Formula (A-7) and Formula (A-12) each independently may have a substituent. The substituent is not particularly limited and has the same definition and the same preferable ranges as the substituent which may be included in the aromatic hydrocarbon group and the aromatic heterocyclic group which may be used as $A^{10}$.

$A^{12}$ represents preferably an aromatic heterocyclic group represented by any one of Formulae (A-1) to (A-6), (A-8) to (A-10), and (A-12) among the Formulae (A-1) to (A-12), more preferably an aromatic heterocyclic group represented by Formula (A-1), Formula (A-3), Formula (A-4), or Formula (A-6), and still more preferably an aromatic heterocyclic group represented by Formula (A-3).

The group represented by the following Formula (1-1) will be described.

$$*\text{-}L_a\text{-}Ar\text{-}(L_b)_l \qquad (1\text{-}1)$$

In Formula (1-1), $L_a$ represents an alkylene group having 1 to 20 carbon atoms which may have at least one of —O—, —S—, or —NR$^{1S}$— in a carbon chain.

In the present invention, examples of the alkylene group having —O— in a carbon chain include a group having —O— in the middle of a carbon-carbon bond, a group having —O— at one terminal or both terminals of a carbon-carbon bond, and a group having —O— in the middle of and at one terminal or both terminals of a carbon-carbon bond. The same shall be applied to the alkylene group having —S— or —NR$^{1S}$— in a carbon chain. In addition, in a case where the alkylene group has —O—, —S—, and —NR$^{1S}$—, the total number of these groups is at least one, and the upper limit thereof is not particularly limited and is, for example, 5.

The alkylene group which may be used as $L_a$ may be linear, branched, or cyclic and is preferably a linear or branched alkylene group. From the viewpoints of carrier mobility and solubility, the number of carbon atoms in the alkylene group is preferably 1 to 15 and more preferably 1 to 10.

In a case where the alkylene group which may be used as $L_a$ is branched, the number of carbon atoms in the branch portion is included in the number of carbon atoms in the alkylene group represented by $L_a$. In a case where $L_a$ represents —NR$^{1S}$— in which $R^{1S}$ has a carbon atom, the number of carbon atoms in $R^{1S}$ is not included in the number of carbon atoms in the alkylene group which may be used as $L_a$.

Ar represents an aromatic heterocyclic group or an aromatic hydrocarbon group having 6 to 18 carbon atoms.

The aromatic heterocyclic group which may be used as Ar may be a monocyclic group or a fused ring group composed of 2 or more rings. From the viewpoints of carrier mobility and heat resistance, it is preferable that the aromatic hydrocarbon group is a monocyclic group. In a case where the aromatic heterocyclic group is a monocyclic group, it is preferable that the number of ring members is 5 to 7. In addition, as the ring-constituting heteroatom included in the aromatic heterocyclic group, a nitrogen atom, an oxygen atom, a sulfur atom, or a selenium atom is preferable, and a sulfur atom is more preferable.

As the aromatic heterocyclic group which may be used as Ar, an aromatic heterocyclic group other than the aromatic heterocyclic groups represented by Formulae (A-1) to (A-12) is preferable among the aromatic heterocyclic groups which may be used as $A^1$.

The aromatic hydrocarbon group having 6 to 18 carbon atoms which may be used as Ar is not particularly limited, and examples thereof include a benzene ring group, a naphthalene ring group, and a group obtained by removing two or more hydrogen atoms from an aromatic hydrocarbon (for example, a fluorene ring) in which three or more rings are fused. Among these, from the viewpoints of carrier mobility and heat resistance, a benzene ring group or a naphthalene ring group is preferable, and a benzene ring group is more preferable.

$L_b$ represents an alkyl group having 1 to 100 carbon atoms which may have at least one of —O—, —S—, or —NR$^{2S}$— in a carbon chain.

The alkyl group which may be used as $L_b$ may be linear, branched, or cyclic. From the viewpoints of carrier mobility and solubility, a linear or branched alkyl group is preferable, and a branched alkyl group is more preferable. In addition, the alkyl group may be an alkyl halide group having a halogen atom (preferably a fluorine atom, a chlorine atom, a bromine atom, or an iodine atom and more preferably a fluorine atom) as a substituent.

The number of carbon atoms in the alkyl group which may be used as $L_b$ is 1 to 100 and preferably 9 to 100.

In addition, in a case where the group represented by Formula (1-1) has a plurality of $L_b$'s, from the viewpoints of carrier mobility and solubility, at least one $L_b$ represents preferably the alkyl group having 9 to 100 carbon atoms, more preferably the alkyl group having 20 to 100 carbon atoms, and still more preferably the alkyl group having 20 to 40 carbon atoms.

In a case where the alkyl group which may be used as $L_b$ is branched, the number of carbon atoms in the branch portion is included in the number of carbon atoms in the alkyl group which may be used as $L_b$. In a case where $L_b$ includes —$NR^2$— in which $R^2$ has a carbon atom, the number of carbon atoms in $R^2$ is not included in the number of carbon atoms in the alkylene group which may be used as 4.

$R^{1S}$ and $R^{2S}$ each independently represent a hydrogen atom or a substituent. The substituent which may be used as $R^{1S}$ and $R^{2S}$ is not particularly limited, and examples thereof include an alkyl group (preferably a linear or branched alkyl group having 1 to 10 carbon atoms), a halogen atom (preferably a fluorine atom, a chlorine atom, a bromine atom, or an iodine atom), and an aromatic hydrocarbon group (preferably an aromatic hydrocarbon group having 6 to 20 carbon atoms). In particular, $R^{1S}$ and $R^{2S}$ each independently represent preferably a hydrogen atom or an alkyl group and more preferably an alkyl group.

The position of Ar (ring-constituting atom) to which $L_b$ is bonded is not particularly limited. For example, it is preferable that Ar is in the 2-position to 4-position with respect to $L_a$ (the ring-constituting atom to which $L_a$ is bonded is in the 1-position), and it is more preferable that at least one $L_b$ is bonded to the 4-position.

l represents an integer of 1 to 5 and preferably 1 or 2. In a case where l represents an integer of 2 or more, a plurality of $L_b$'s may be the same as or different from each other.

In Formula (1-1), * represents a binding site for introduction to the repeating unit. In this binding site, for example, $L_a$ as the group represented by Formula (1-1) is bonded to the chrysene fused ring group, an aromatic hydrocarbon group, an aromatic heterocyclic group, or a vinylene group which may be used as $A^{10}$, a ring-constituting nitrogen atom in Formula (A-1) or (A-2), a nitrogen atom in $NR^X$ of $X^A$, a nitrogen atom in $NR^A$ of $W^A$, or an aromatic hydrocarbon group or an aromatic heterocyclic group represented by $A^{11}$ or $A^{13}$ described below.

Examples of the aromatic heterocyclic groups represented by Formulae (A-1) to (A-12) will be shown below and in Examples, but the present invention is not limited to these examples. In the following aromatic heterocyclic groups, $R^N$, $R^X$, and * are as described above.

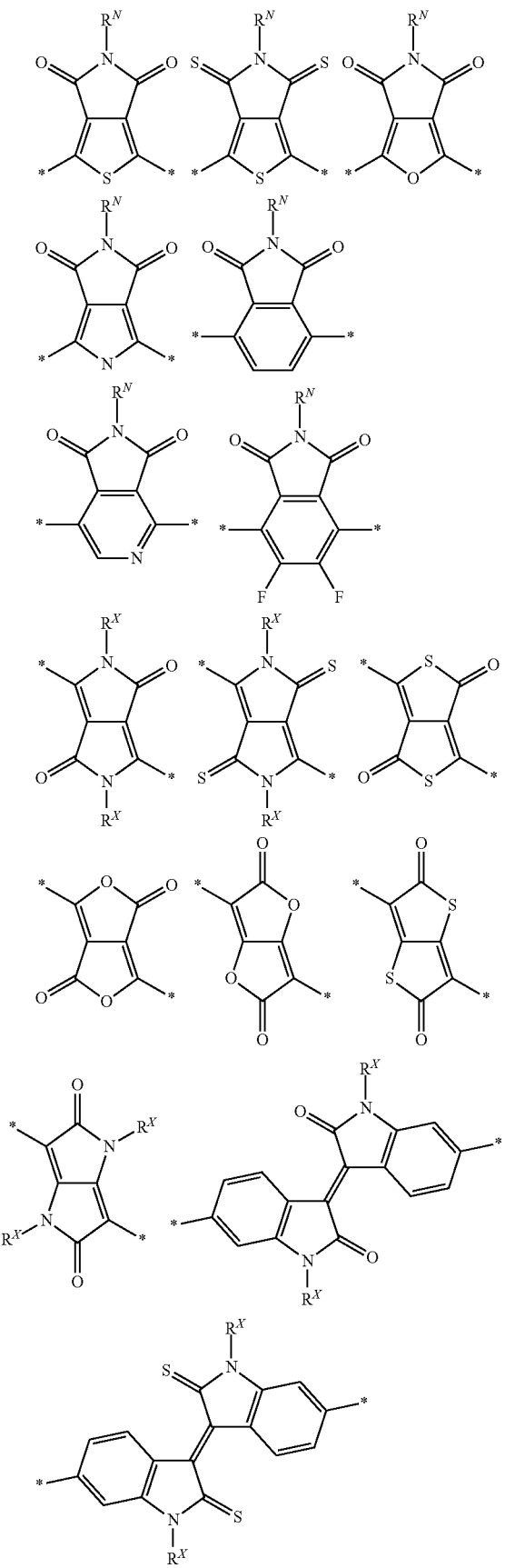

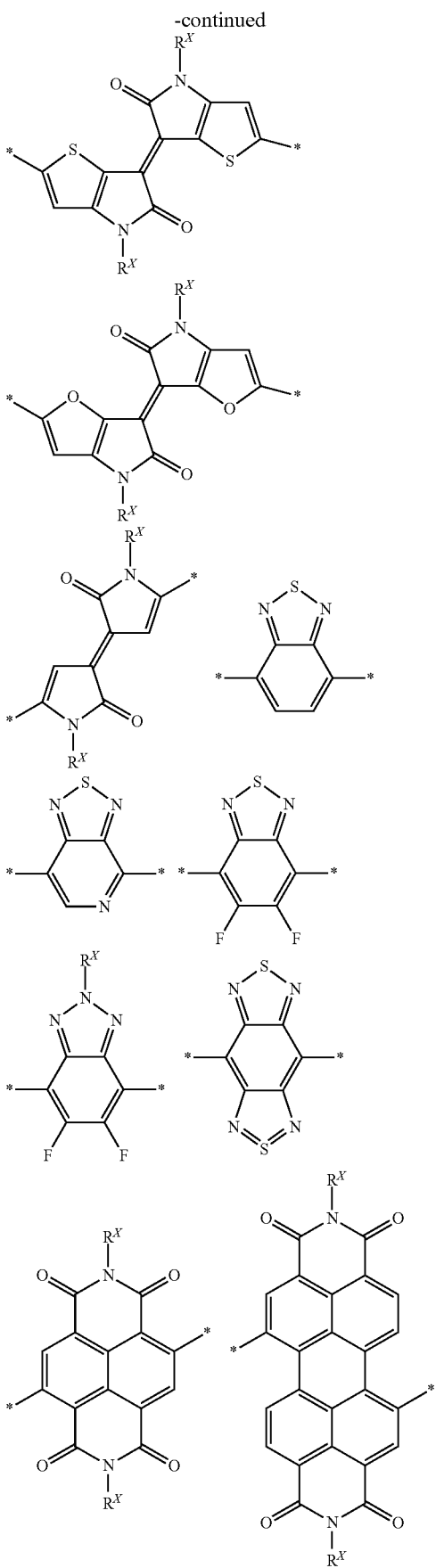

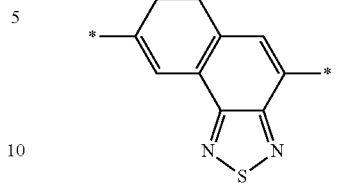

In Formula (4) and Formula (5), $m^{12}$ represents an integer of 0 to 4, preferably 1 to 4, more preferably 1 to 3, still more preferably 1 or 2, and even still more preferably 1.

In a case where $m^{12}$ represents an integer of 2 to 4, a plurality of $A^{12}$'s may represent the same aromatic heterocyclic group or different aromatic heterocyclic groups.

$A^{11}$ and $A^{13}$ each independently represent an aromatic hydrocarbon group, an aromatic heterocyclic group other than aromatic heterocyclic groups represented by Formulae (A-1) to (A-12), a vinylene group, or an ethynylene group.

The aromatic hydrocarbon group and the vinylene group which may be used as $A^{11}$ and $A^{13}$ are not particularly limited and have the same definitions and the same preferable ranges as the aromatic hydrocarbon group and the vinylene group which may be used as $A^{10}$.

The aromatic heterocyclic group which may be used as $A^{11}$ and $A^{11}$ is not particularly limited as long as it is an aromatic heterocyclic group other than the aromatic heterocyclic groups represented by Formulae (A-1) to (A-12), and may be a monocyclic group or a fused ring group composed of 2 or more rings. In addition, the aromatic heterocyclic group may be a group in which monocyclic or fused heterocyclic groups are linked through a carbon-carbon double bond. In a case where the aromatic heterocyclic group is a monocyclic group, it is preferable that the number of ring members is 5 to 7. In addition, as the ring-constituting heteroatom included in the aromatic heterocyclic group, a nitrogen atom, an oxygen atom, a sulfur atom, or a selenium atom is preferable, and a sulfur atom is more preferable.

The aromatic heterocyclic group which may be used as $A^{11}$ and $A^{10}$ has the same definition and the same preferable ranges as the aromatic heterocyclic group other than the aromatic heterocyclic groups represented by Formulae (A-1) to (A-12) among the aromatic heterocyclic groups which may be used as $A^{10}$.

$A^{11}$ and $A^{13}$ each independently represent preferably an aromatic hydrocarbon group or an aromatic heterocyclic group, more preferably a benzene ring or an aromatic heterocyclic group, still more preferably a benzene ring or a group represented by Formula (Ar-1) shown below, even still more preferably a benzene ring, a furan ring, a thiophene ring, or a selenophene ring, and most preferably a thiophene ring.

$A^{11}$ and $A^{13}$ may be the same as or different from each other.

$A^{11}$ and $A^{11}$ each independently may have a substituent. The substituent is not particularly limited and has the same definition and the same preferable ranges as the substituent which may be included in the aromatic hydrocarbon group and the aromatic heterocyclic group which may be used as $A^{10}$.

In Formula (4) and Formula (5), it is preferable that -($A^{11}$)$m^{11}$- and -($A^{11}$)$m^{13}$- are each independently represented by the following Formula (Ar-1), and it is more preferable that $A^{12}$ represents an aromatic heterocyclic groups represented by the following Formulae (A-1) to (A-12) and both $-(A^{11})m^{11}-$ and $-(A^{13})m^{13}-$ are represented by the following Formula (Ar-1).

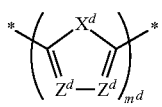
(Ar-1)

In Formula (Ar-1), * represents a binding site to another group forming the repeating unit represented by Formula (4) or Formula (5).

$X^d$ represents an oxygen atom, a sulfur atom, a selenium atom, or $NR^{D1}$. $X^d$ represents preferably an oxygen atom, a sulfur atom, or a selenium atom, more preferably an oxygen atom or a sulfur atom, and still more preferably a sulfur atom.

$Z$'s each independently represent a nitrogen atom or $CR^{D2}$. In the ring represented by the above formula, an aspect in which one of the two $Z^d$'s represents a nitrogen atom and the other one of the two $Z^d$'s represents $CR^D$ or an aspect in which the two $Z^d$'s represent $CR^{D2}$ is preferable, and an aspect in which the two $Z^d$'s represent $CR^{D2}$ is more preferable.

$R^{D1}$ and $R^{D2}$ each independently represent a hydrogen atom or a substituent and preferably a hydrogen atom. The substituent which may be used as $R^{D1}$ and $R^{D2}$ is not particularly limited and has the same definition and the same preferable ranges as the substituent which may be included in the aromatic hydrocarbon group and the aromatic heterocyclic group which may be used as $A^{10}$.

In a case where $R^{D1}$ and $R^{D2}$ each independently represent an alkoxy group, $R^{D1}$ and $R^{D2}$ are bonded to each other to form an alkylenedioxy group, and an alkylenedioxythiophene ring may be formed as a ring represented by Formula (Ar-1). The number of carbon atoms in the alkylene group is as described above and is preferably 1 to 3.

In Formula (Ar-1), an aspect in which $X^d$ represents a sulfur atom and all the $Z^d$'s represent $CR^{D2}$ ($R^{D2}$ represent preferably a hydrogen atom) is preferable.

In Formula (Ar-1), in a case where all the $Z^d$'s represent $CR^{D2}$ and $R^{D2}$ represent a substituent, two $R^{D2}$'s may be bonded to each other to form a ring.

In Formula (Ar-1), $m^d$ represents an integer of 1 to 4 and preferably 1 or 2.

In Formula (4) and Formula (5), $m^{11}$ and $m^{13}$ each independently represent an integer of 0 to 4, preferably 0 to 2, and more preferably 1 or 2.

In a case where $m^{11}$ and $m^{13}$ each independently represent an integer of 2 to 4, a plurality of $A^{11}$'s and a plurality of $A^{13}$'s may be the same as or different from each other.

In Formula (4) and Formula (5), $m^{11}$ to $m^{13}$ may each independently represent 0. However, it is preferable that all the $m^{11}$ to $m^{13}$ do not represent 0, that is, the sum of $m^{11}$, $m^{12}$ and $m^{13}$ is 1 or more. Specifically, the sum of $m^{11}$, $m^{12}$, and $m^{13}$ is preferably 1 to 12.

In the repeating unit represented by Formula (4) or Formula (5), in a case where $m^2$ represents 0, a group (a group corresponding to $A^{11}$ and $A^{13}$) other than the chrysene fused ring group in the repeating unit preferentially belongs to $A^{11}$. For example, it is considered that $m^{11}$ represents 4 and $m^{13}$ represents 0 in a polymer 1 used in Examples.

Specific examples of the repeating unit represented by Formula (1) will be shown below and in Examples, but the present invention is not limited thereto.

In each of the following specific examples, TIPS represents a triisopropylsilyl group. In addition, at least one hydrogen atom may be substituted with, for example, an alkyl group which may have at least one of —O—, —S—, or —NR— or the group represented by Formula (1-1). The alkyl group has the same definition as the alkyl group as a preferable substituent which may be used as $R^{C1}$. R represents a hydrogen atom or a substituent, and the substituent which may be used as R has the same definition as the substituent of $R^{1S}$ and $R^{2S}$.

In the following specific examples, examples including a chrysene fused ring group CR-1 in which two Z rings represent a thiophene ring group are shown. However, examples including the following chrysene fused ring groups CR-2 to CR-16 instead of the chrysene fused ring group CR-1 can also be used. In the following chrysene fused ring groups, $R^{ZN}$ has the same definition as $R^{ZN}$ described above.

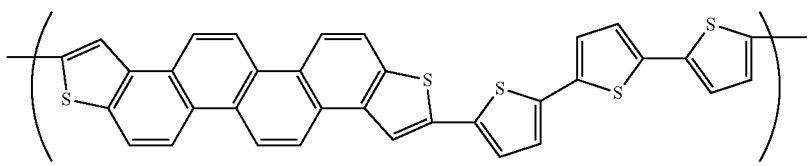

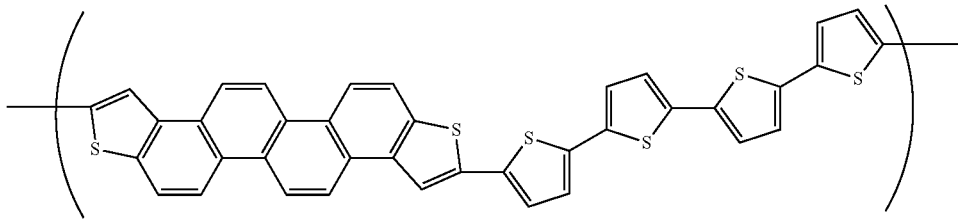

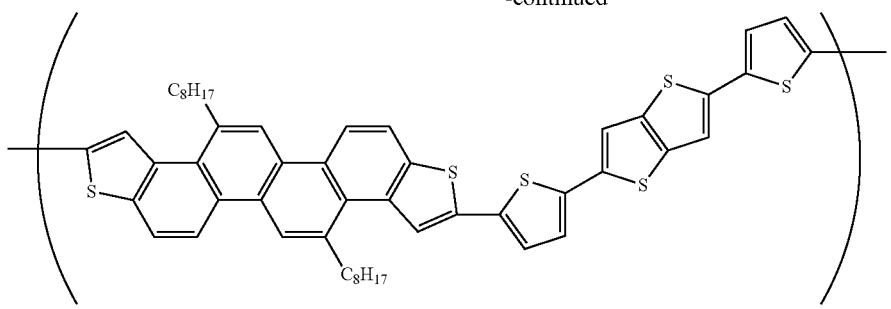
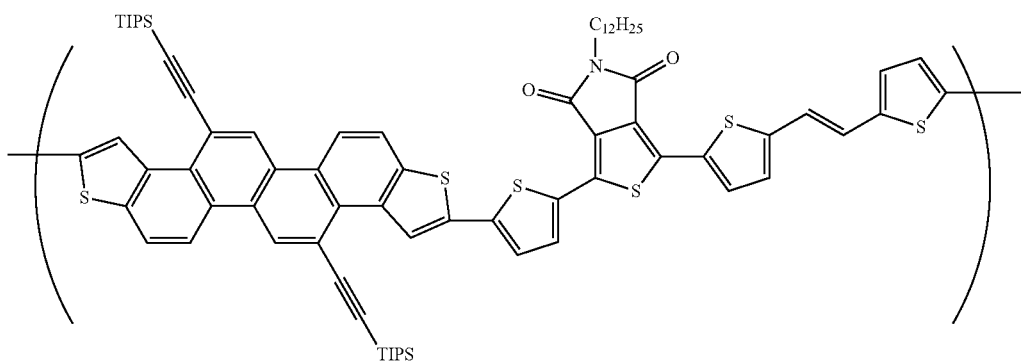
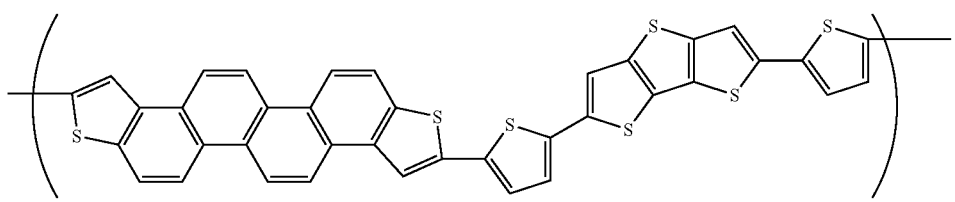
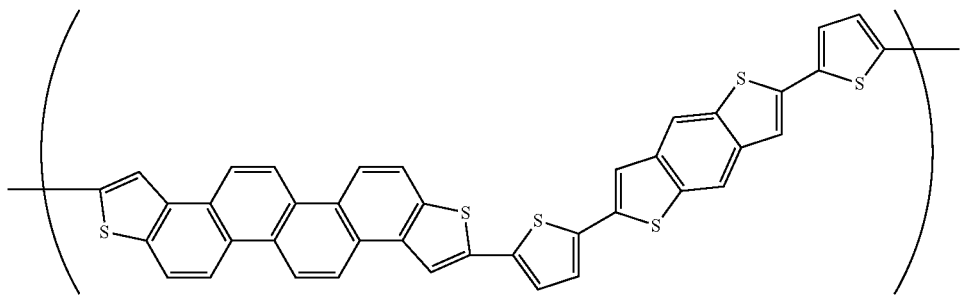
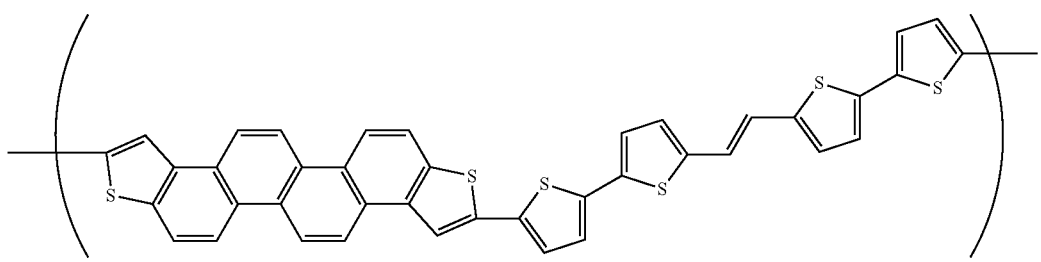

-continued
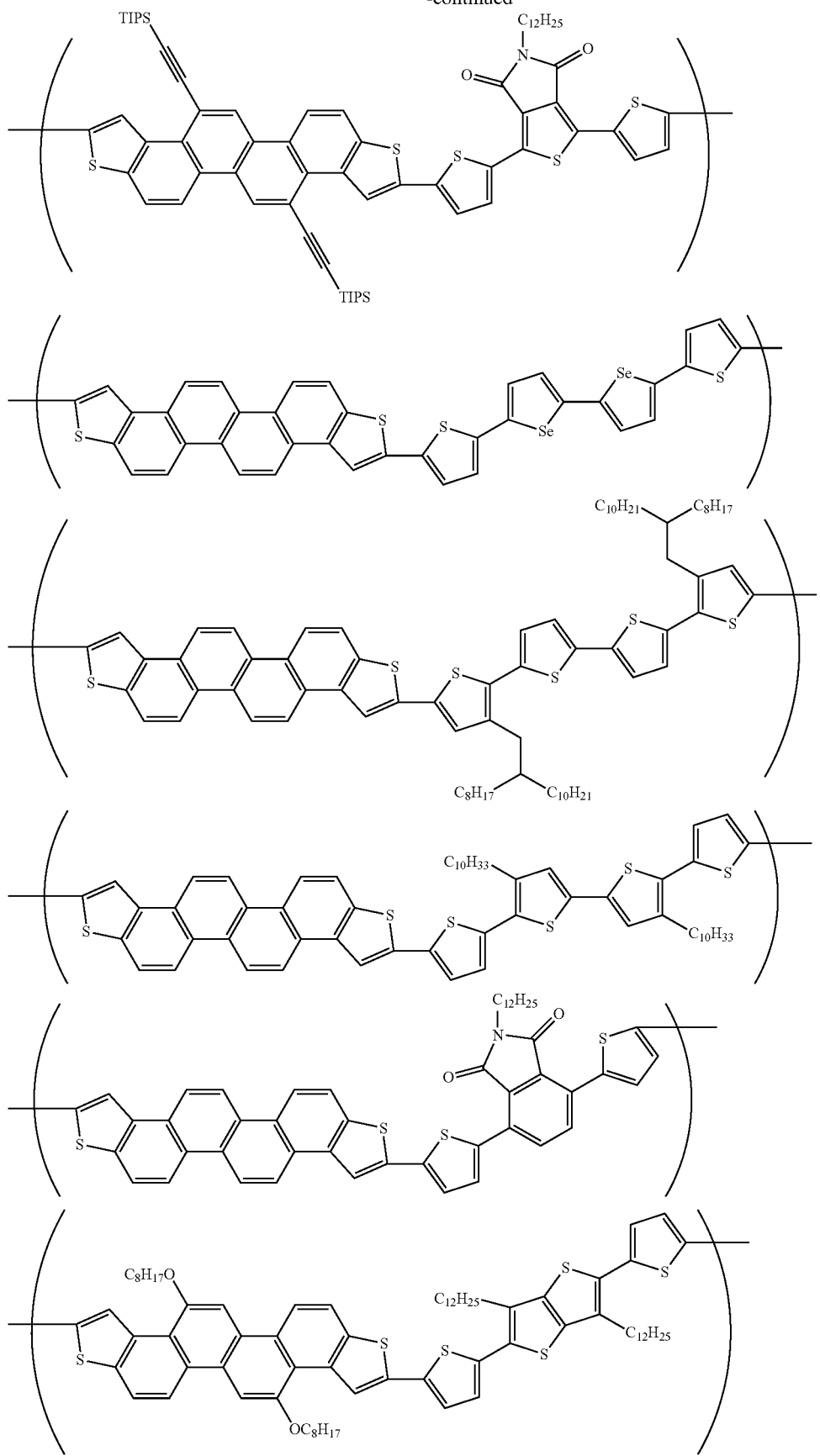

-continued
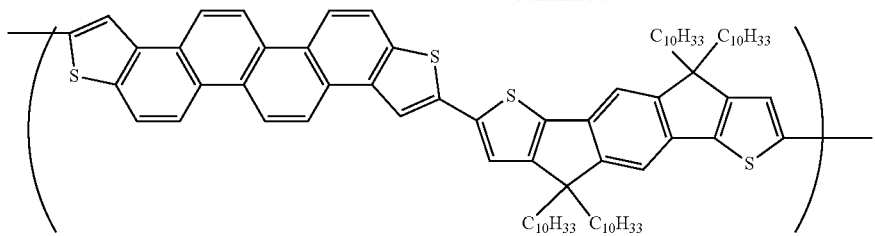
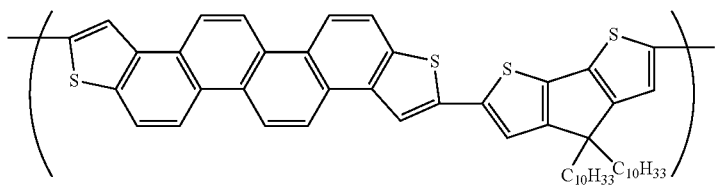
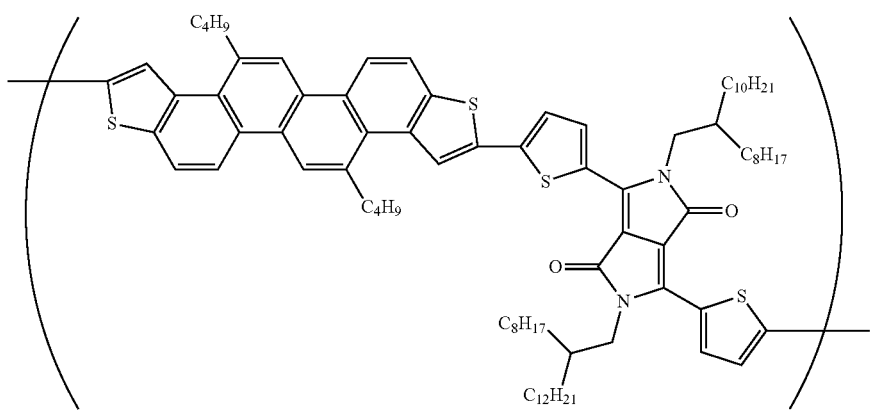
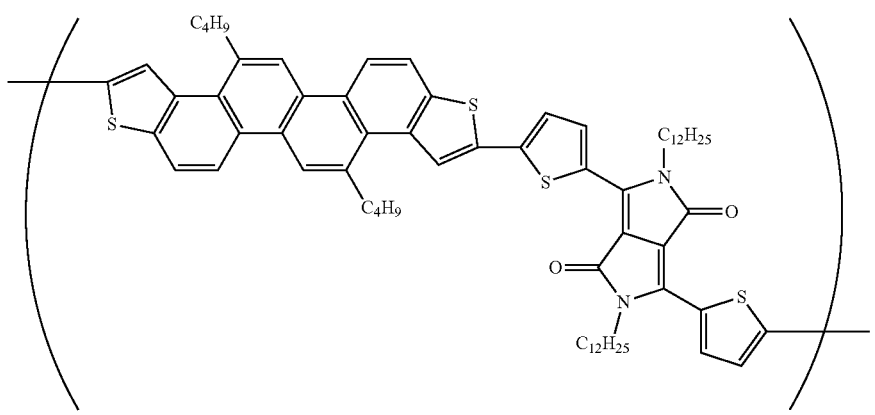
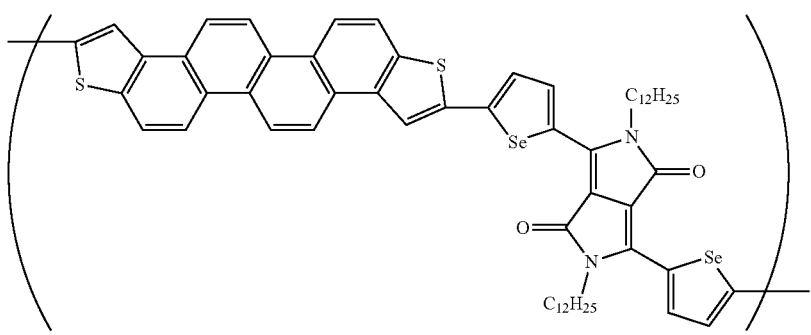

-continued
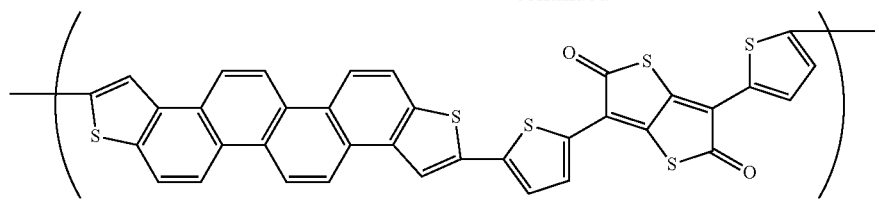
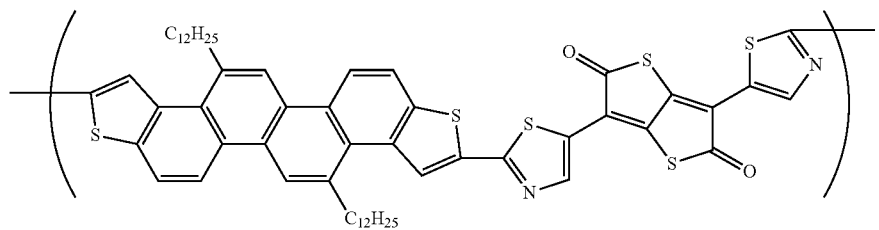
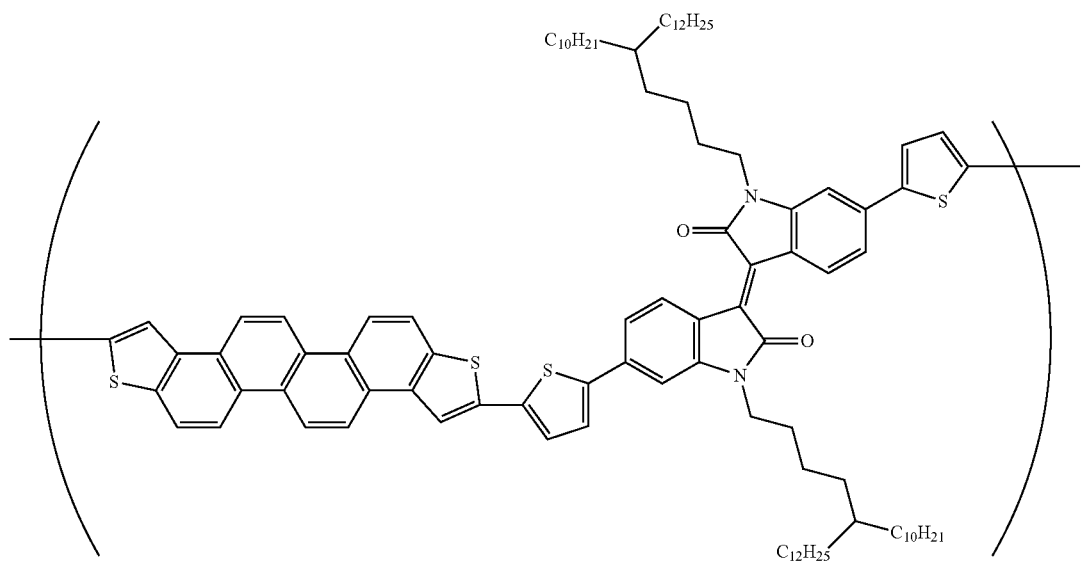
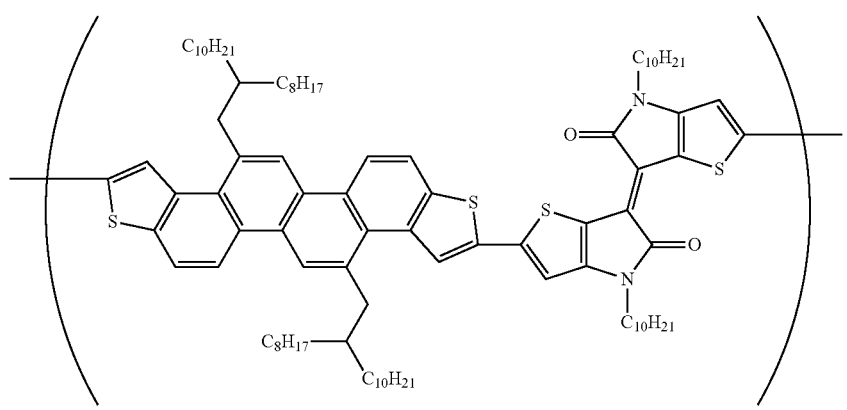
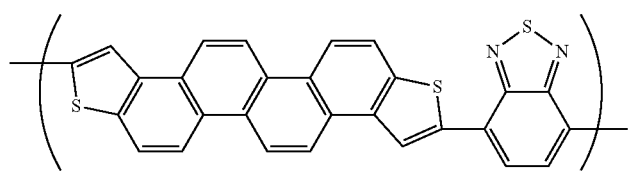

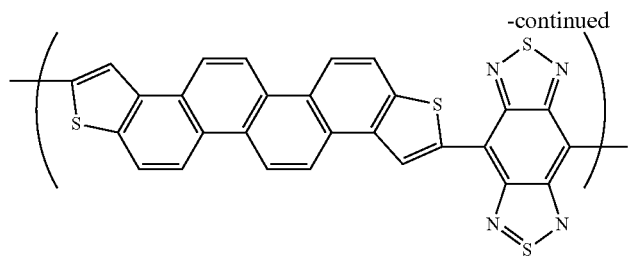
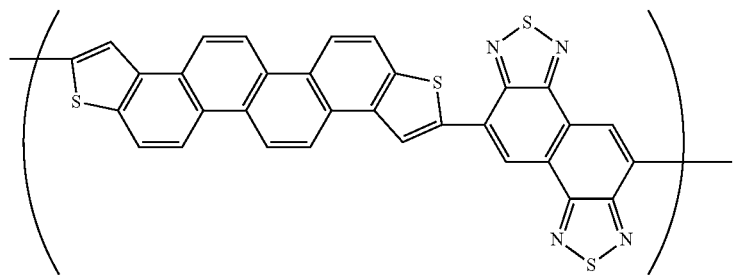
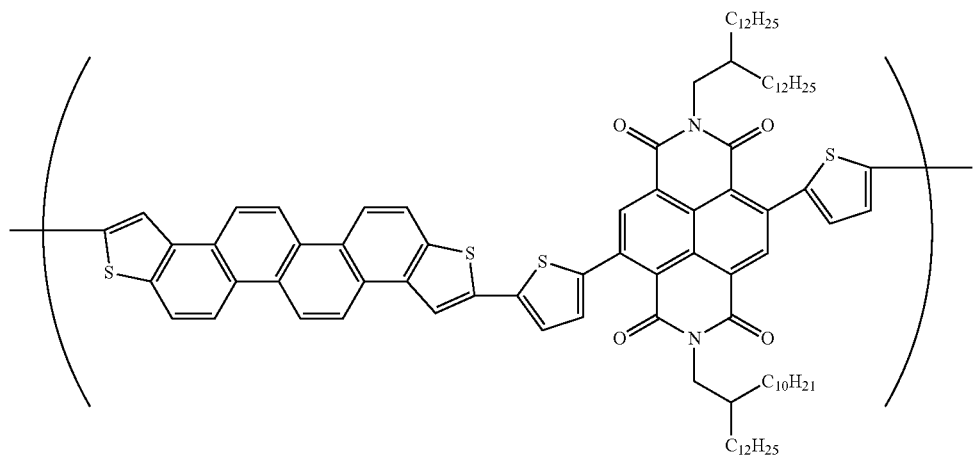
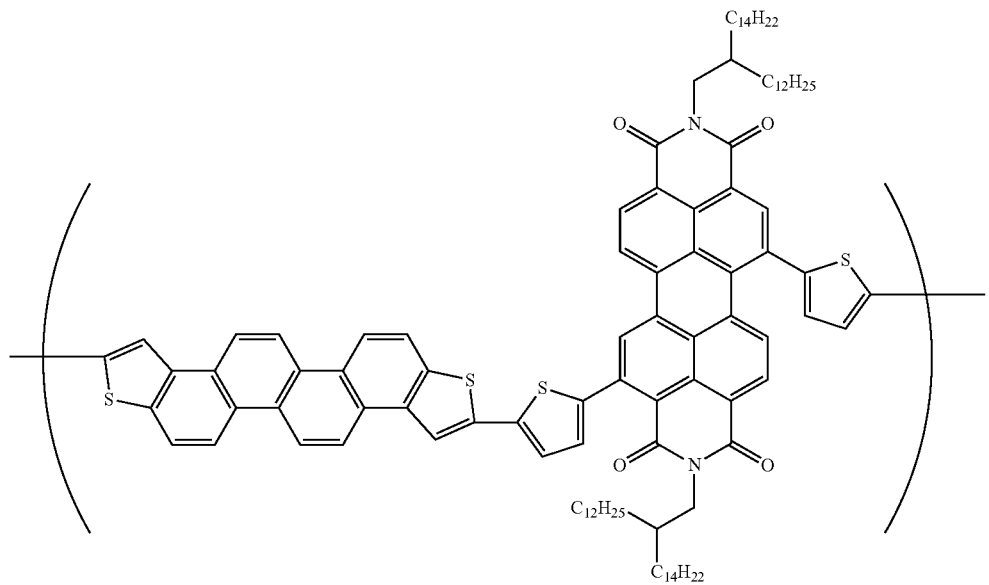

-continued
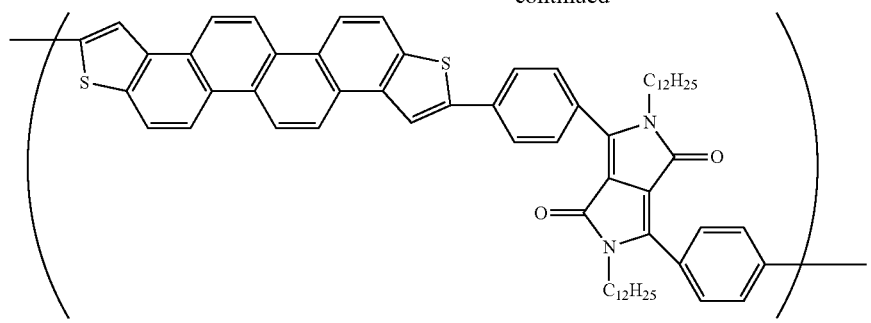
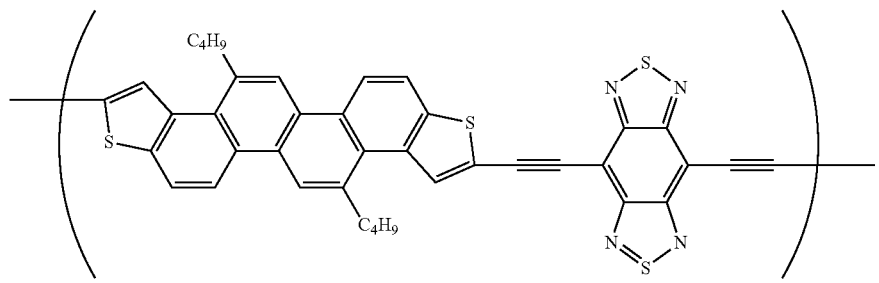
CR-1
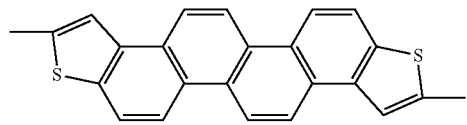
CR-2
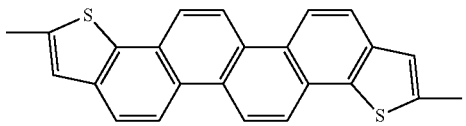
CR-3
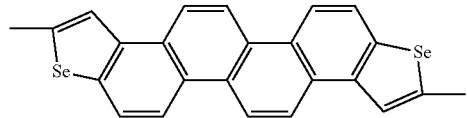
CR-4
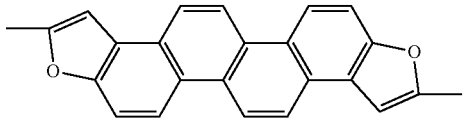
CR-5
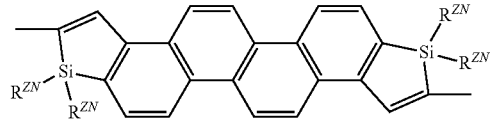
CR-6
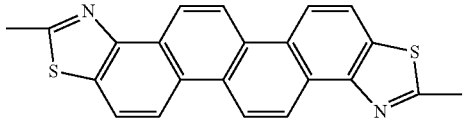
CR-7
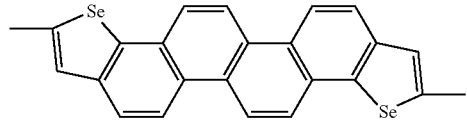
CR-8
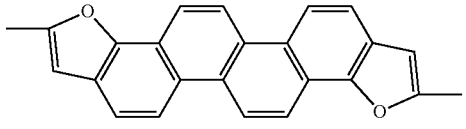
CR-9
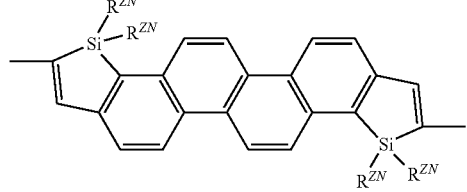
CR-10
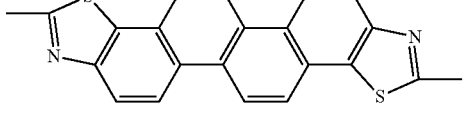
CR-11
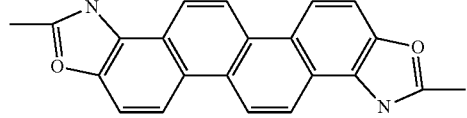
CR-12
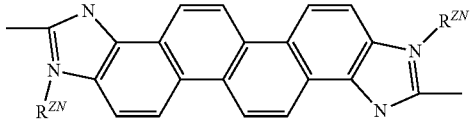
CR-13
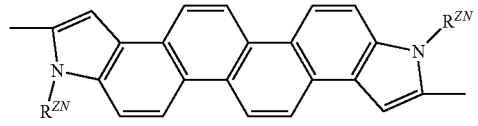
CR-14
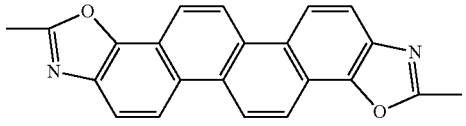

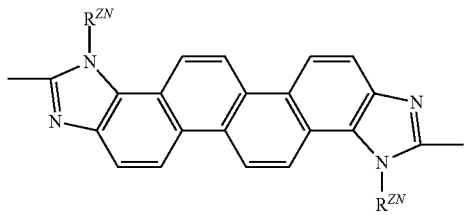

CR-15

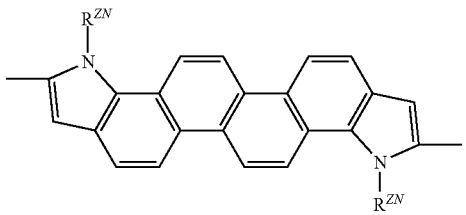

CR-16

The polymer according to the embodiment of the present invention may include one repeating unit represented by Formula (1) or two or more repeating units represented by Formula (1).

The polymer according to the embodiment of the present invention includes two or more repeating units represented by Formula (1). The polymer including two or more repeating units may be a random copolymer or a block copolymer. The polymer according to the embodiment of the present invention may be an oligomer in which the number of repeating units (polymerization degree) n is 2 to 9, or a polymer compound (polymer) in which the number of repeating units (polymerization degree) n is 10 or more. In particular, it is preferable that the polymer according to the embodiment of the present invention is a polymer compound from the viewpoint of simultaneously obtaining high carrier mobility and high heat resistance.

The polymerization degree n can be calculated based on a weight-average molecular weight described below and the mass of each of the repeating units.

The polymer according to the embodiment of the present invention may include a repeating unit (referred to as "the other repeating unit") other than the repeating unit represented by Formula (1). In the polymer according to the embodiment of the present invention, the other repeating unit may be present at a main chain thereof, or may be present between the chrysene fused ring group and A in the repeating unit represented by Formula (1).

In the polymer according to the embodiment of the present invention, the content of the repeating unit represented by Formula (1) is preferably 60% to 100%, more preferably 80% to 100%, and still more preferably 90% to 100% with respect to the total mol number of all the repeating units in the polymer according to the embodiment of the present invention. It is even still more preferable that the polymer according to the embodiment of the present invention substantially consists of only the repeating unit represented by Formula (1). "Substantially consisting of only the repeating unit represented by Formula (1)" represents that the molar ratio of the repeating unit represented by Formula (1) in the polymer is 95% or higher, preferably 97% or higher, and more preferably 99% or higher.

In a case where the content of the repeating unit represented by Formula (1) is in the above-described range, an organic semiconductor element having a higher carrier mobility and higher organic semiconductor film properties can be obtained.

From the viewpoints of carrier mobility and heat resistance, the weight-average molecular weight of the polymer according to the embodiment of the present invention is preferably higher than 3000, more preferably 10000 or higher, still more preferably 20000 or higher, even still more preferably 30000 or higher, and most preferably 45000 or higher. In addition, from the viewpoints of solubility, the weight-average molecular weight is preferably 1000000 or lower, more preferably 300000 or lower, still more preferably 200000 or lower, and even still more preferably 150000 or lower.

In the present invention, the weight-average molecular weight and the number-average molecular weight are measured by gel permeation chromatography (GPC) in terms of standard polystyrene. Specifically, for example, HLC-8121GPC (manufactured by Tosoh Corporation) is used as a GPC, two columns $GMH_{HR}$-H (20) HT (manufactured by Tosoh Corporation, 7.8 mm ID×30 cm) are used as columns, and 1,2,4-trichlorobenzene is used as an eluent. In addition, the measurement can be used using an infrared (IR) detector under conditions of sample concentration: 0.02 mass %, flow rate: 1.0 mL/min, sample injection volume: 300 μL, and measurement temperature: 160° C. In addition, a calibration curve can be obtained from 12 samples of "Standard samples, TSK standard, polystyrene": "F-128", "F-80", "F-40", "F-20", "F-10", "F-4", "F-2", "F-1", "A-5000", "A-2500", "A-1000", and "A-500" (manufactured by Tosoh Corporation).

A terminal structure of the polymer according to the embodiment of the present invention is not particularly limited and is not uniquely determined depending on whether or not the other repeating unit is present, the kind of a base material used for the synthesis, or the kind of a quenching agent (reaction terminator) used for the synthesis. Examples of the terminal structure include a hydrogen atom, a hydroxy group, a halogen atom, an ethylenically unsaturated group, an alkyl group, an aromatic heterocyclic group (preferably a thiophene ring), and an aromatic hydrocarbon group (preferably a benzene ring).

A synthesis method of the polymer according to the embodiment of the present invention is not particularly limited, and the polymer according to the embodiment of the present invention can be synthesized using a typical method. For example, respective precursor compounds with which the chrysene fused ring group in Formula (1) and the respective groups represented by $A^{10}$ can be introduced are synthesized, and the respective precursors are caused to undergo a cross-coupling reaction such as a Suzuki coupling reaction or a Stille coupling reaction. As a result, the polymer can be synthesized. The synthesis of the polymer according to the embodiment of the present invention can be referred to, for example, JP2010-527327A, JP2007-516315A, JP2014-515043A, JP2014-507488A, JP2011-501451 A, JP2010-18790A, WO2012/174561A, JP2011-514399A, and JP2011-514913A.

[Organic Semiconductor Composition]

Next, an organic semiconductor composition according to the embodiment of the present invention will be described.

The organic semiconductor composition includes the above-described polymer and a solvent, and is preferably used for forming an organic semiconductor film according to the embodiment of the present invention.

<Polymer>

As described above, one polymer may be used alone, or two or more polymers may be used in combination.

The content of the polymer in the organic semiconductor composition is not particularly limited and can be expressed as, for example, the content in solid matter excluding the solvent described below. It is preferable that the content in the solid matter is in the same range as the content of the polymer in the organic semiconductor film described below.

<Solvent>

The solvent is not particularly limited as long as the above-described polymer is soluble or dispersible therein, and examples thereof include an inorganic solvent and an organic solvent. Among these, an organic solvent is preferable. As the solvent, one kind may be used alone, or two or more kinds may be used in combination.

The organic solvent is not particularly limited, and examples thereof include: an (aliphatic) hydrocarbon solvent such as hexane, octane, or decane; an aromatic hydrocarbon solvent such as toluene, xylene, mesitylene, ethylbenzene, decaline, 1-methylnaphthalene, tetralin, or anisole; a ketone solvent such as acetone, methyl ethyl ketone, methyl isobutyl ketone, or cyclohexanone; a halogenated hydrocarbon solvent such as dichloromethane, chloroform, tetrachloromethane, dichloroethane, trichloroethane, tetrachloroethane, chlorobenzene, dichlorobenzene, or chlorotoluene; an ester solvent such as ethyl acetate, butyl acetate, amyl acetate, or ethyl lactate; an alcohol solvent such as methanol, propanol, butanol, pentanol, hexanol, cyclohexanol, methyl cellosolve, ethyl cellosolve, or ethylene glycol; an ether solvent such as butoxybenzene, dibutyl ether, tetrahydrofuran, or dioxane; an amide solvent such as N,N-dimethylformamide or N,N-dimethylacetamide; an imide solvent such as 1-methyl-2-pyrrolidone or 1-methyl-2-imidazolidinone; a sulfoxide solvent such as dimethyl sulfoxide; and a nitrile solvent such as acetonitrile.

The content of the solvent in the organic semiconductor composition is preferably 90 to 99.99 mass %, more preferably 95 to 99.99 mass %, and still more preferably 96 to 99.95 mass %.

<Other Components>

The organic semiconductor composition according to the embodiment of the present invention may further include components other than the polymer according to the embodiment of the present invention and the solvent.

Examples of the components include a binder polymer and various additives.

(Binder Polymer)

As the binder polymer, any binder polymer can be used without any particular limitation to binder polymers which are typically used in an organic semiconductor composition.

Examples of the binder polymer include: an insulating polymer such as polystyrene, poly(α-methyl styrene), polyvinyl cinnamate, poly(4-divinylbenzene), poly(4-vinyl phenol), poly(4-methyl styrene), polycarbonate, polyarylate, polyester, polyamide, polyimide, polyurethane, polysiloxane, polysulfone, polymethyl methacrylate, polymethyl acrylate, cellulose, polyethylene, or polypropylene and a copolymer thereof; a semiconductor polymer such as polysilane, polycarbazole, polyarylamine, polyfluorene, polythiophene, polypyrrole, polyaniline, polyparaphenylene vinylene, polyacene, or polyheteroacene, and a copolymer thereof; rubber, and a thermoplastic elastomer.

In particular, as the binder polymer, a polymer compound having a benzene ring (a polymer which includes a repeating unit having a benzene ring group) is preferable. The content of the repeating unit having a benzene ring group is not particularly limited and is preferably 50 mol % or higher, more preferably 70 mol % or higher, and still more preferably 90 mol % or higher with respect to all the repeating units. The upper limit is not particularly limited and, for example, 100 mol %.

The weight-average molecular weight of the binder polymer is not particularly limited and is preferably 1000 to 10000000, more preferably 3000 to 5000000, and still more preferably 5000 to 3000000.

The content of the binder polymer in the organic semiconductor composition is not particularly limited. For example, the content in the solid matter is preferably in the same range as the content of the binder polymer in the organic semiconductor film described below.

In a case where an organic semiconductor element, in particular, an organic semiconductor film of an organic thin film transistor element is formed using the organic semiconductor composition in which the content of the binder polymer is in the above-described range, the carrier mobility and heat resistance are further improved.

(Additives)

As the additives, any additives can be used without any particular limitation to additives which are typically used in an organic semiconductor composition.

The content of the additives in the organic semiconductor composition is not particularly limited. For example, the content in the solid matter is preferably in the same range as the content of the additives in the organic semiconductor film described below. In a case where the content of the additives is in the above-described range, film forming properties are excellent. For example, in a case where an organic semiconductor element, in particular, an organic semiconductor film of an organic thin film transistor element is formed using the organic semiconductor composition in which the content of the additives is in the above-described range, film forming properties are excellent, and the carrier mobility and heat resistance are further improved.

<Preparation Method>

A preparation method of the organic semiconductor composition is not particularly limited, and a typical preparation method can be adopted. For example, the organic semiconductor composition according to the embodiment of the present invention can be prepared by adding predetermined amounts of the respective components to the solvent and appropriately stirring the components.

[Organic Semiconductor Element]

Next, an organic semiconductor element according to the embodiment of the present invention will be described.

The organic semiconductor element according to the embodiment of the present invention includes the organic semiconductor film according to the embodiment of the present invention.

The organic semiconductor element according to the embodiment of the present invention is not particularly limited and is preferably used as a non-light-emitting organic semiconductor device. The non-light-emitting organic semiconductor device is not particularly limited as long as it is a device that does not emit light, and examples thereof include an organic thin film transistor element that controls a current amount or a voltage amount, an organic photoelectric conversion element (for example, a solid image pickup element for an optical sensor or a solar cell for energy conversion) that converts light energy into electric power, an organic thermoelectric conversion element that converts thermal energy into electric power, a gas sensor, an organic rectifying element, an organic inverter, and an information recording element. In the non-light-emitting organic semiconductor device, it is preferable that the organic semiconductor film functions as an electronic element.

<Organic Thin Film Transistor Element>

An organic thin film transistor element as a preferable aspect of the organic semiconductor element according to the embodiment of the present invention will be described.

The organic thin film transistor element (also referred to as "organic TFT element") includes the organic semiconductor film according to the embodiment of the present invention (also referred to as "organic semiconductor layer" or "semiconductor active layer") and may further include a source electrode, a drain electrode, and a gate electrode.

The organic TFT element according to the embodiment of the present invention includes, on a substrate, a gate electrode, an organic semiconductor layer, a gate insulating layer that is provided between the gate electrode and the organic semiconductor layer, and a source electrode and a drain electrode that are provided adjacent to the organic semiconductor layer and are linked to each other through the organic semiconductor layer. In the organic TFT element, the organic semiconductor layer and the gate insulating layer are provided adjacent to each other.

A structure of the organic thin film transistor element according to the embodiment of the present invention is not particularly limited as long as it includes the respective layers.

For example, any structure such as a bottom contact type (a bottom gate-bottom contact type and a top gate-bottom contact type) or a top contact type (a bottom gate-top contact type and a top gate-top contact type) may be adopted. It is more preferable that the organic thin film transistor element according to the embodiment of the present invention is a bottom gate-bottom contact type or bottom gate-top contact type (collectively referred to as "bottom gate type").

Hereinafter, an example of the organic thin film transistor element according to the embodiment of the present invention will be described with reference to the accompanying drawings.

—Bottom Gate-Bottom Contact Type Organic Thin Film Transistor Element—

FIG. 1 is a schematic cross-sectional view showing a bottom gate-bottom contact type organic thin film transistor element 100 as an example of the semiconductor element according to the embodiment of the present invention.

As shown in FIG. 1, the organic thin film transistor element 100 includes a substrate (base material) 10, a gate electrode 20, a gate insulating film 30, a source electrode 40 and a drain electrode 42, an organic semiconductor film 50, and a sealing layer 60 in this order.

Hereinafter, the substrate (base material), the gate electrode, the gate insulating film, the source electrode, the drain electrode, the organic semiconductor film, and the sealing layer, and preparation methods thereof will be described in detail.

(Substrate)

The substrate functions to support the gate electrode, the source electrode, the drain electrode, and the like described below.

The kind of the substrate is not particularly limited, and examples thereof include a plastic substrate, a silicon substrate, a glass substrate, and a ceramic substrate. In particular, from the viewpoints of applicability to each device and costs, a glass substrate or a plastic substrate is preferable.

The thickness of the substrate is not particularly limited and is, for example, preferably 10 mm or less, more preferably 2 mm or less, and still more preferably 1.5 mm or less. On the other hand, the thickness of the substrate is preferably 0.01 mm or more and more preferably 0.05 mm or more.

(Gate Electrode)

As the gate electrode, a typical electrode that is used as a gate electrode of an organic TFT element can be used without any particular limitation.

A material (electrode material) which forms the gate electrode is not particularly limited, and examples thereof include: a metal such as gold, silver, aluminum, copper, chromium, nickel, cobalt, titanium, platinum, magnesium, calcium, barium, or sodium; a conductive oxide such as $InO_2$, $SnO_2$, or indium tin oxide (ITO); a conductive polymer such as polyaniline, polypyrrole, polythiophene, polyacetylene, or polydiacetylene; a semiconductor such as silicon, germanium, or gallium-arsenic; and a carbon material such as fullerene, carbon nanotube, or graphite. Among these, the metal is preferable, and silver or aluminum is more preferable.

The thickness of the gate electrode is not particularly limited and is preferably 20 to 200 nm.

The gate electrode may function as the substrate. In this case, the substrate is not necessarily provided.

A method of forming the gate electrode is not particularly limited, and examples thereof include a method of performing vacuum deposition (hereinafter, simply referred to as "deposition") or sputtering on the substrate using the above-described electrode material and a method of applying or printing a electrode-forming composition including the above-described electrode material. In addition, in a case where an electrode is patterned, examples of a patterning method include a printing method such as ink jet printing, screen printing, offset printing, or relief printing (flexographic printing); a photolithography method, and a mask deposition method.

(Gate Insulating Layer)

The gate insulating film is not particularly limited as long as it is an insulating film (layer) and may have a single-layer structure or a multi-layer structure.

It is preferable that the gate insulating layer is formed of an insulating material, and preferable examples of the insulating material include an organic polymer and an inorganic oxide.

The organic polymer, the inorganic oxide, or the like is not particularly limited as long as it has insulating characteristics, and an organic polymer or an inorganic oxide with which a thin film, for example, a thin film having a thickness of 1 m or less can be formed is preferable.

As the organic polymer or the inorganic oxide, one kind may be used alone, and two or more kinds may be used in combination. In addition, an organic polymer or an inorganic oxide may be used in combination.

The organic polymer is not particularly limited, and examples thereof include: a poly(meth)acrylate such as polyvinyl phenol, polystyrene (PS), or polymethyl methacrylate; a cyclic fluoroalkyl polymer such as polyvinyl alcohol, polyvinyl chloride (PVC), polyvinylidene fluoride (PVDF), polytetrafluoroethylene (PTFE), or CYTOP (registered trade name); a polyorganosiloxane such as polycycloolefin, polyester, polyethersulfone, polyether ketone, polyimide, an epoxy resin, or polydimethylsiloxane (PDMS); polysilsesquioxane; and butadiene rubber. In addition to the above-described examples, a thermosetting resin such as a phenolic resin, a novolac resin, a cinnamate resin, an acrylic resin, or a polyparaxylylene resin may also be used.

The organic polymer can also be used in combination with a compound having a reactive substituent such as an alkoxysilyl group, a vinyl group, an acryloyloxy group, an epoxy group, or a methylol group.

In a case where the gate insulating layer is formed of the organic polymer, it is preferable that the organic polymer is crosslinked and cured, for example, in order to improve solvent resistance or insulation resistance of the gate insulating layer. It is preferable that crosslinking is performed by generating an acid or a radical using either or both light and heat.

In a case where the organic polymer is crosslinked by a radical, as a radical generator that generates a radical using light or heat, for example, a thermal polymerization initiator (H1) and a photopolymerization initiator (H2) described in paragraphs "0182" to "0186" of JP2013-214649A, a photoradical generator described in paragraphs "0046" to "0051" of JP2011-186069A, or a photoradical polymerization initiator described in paragraphs "0042" to "0056" of JP2010-285518A can be preferably used, the contents of which are preferably incorporated herein by reference.

In addition, "a compound (G) having a number-average molecular weight (Mn) of 140 to 5000, having a crosslinking functional group, and not having a fluorine atom" which is described in paragraphs "0167" to "0177" of JP2013-214649A can also be preferably used, the contents of which are incorporated herein by reference.

In a case where the organic polymer is crosslinked by an acid, as a photoacid generator that generates an acid using light, for example, a photocationic polymerization initiator described in paragraphs "0033" and "0034" of JP2010-285518A or an acid generator, in particular, a sulfonium salt or an iodonium salt described in paragraphs "0120" to "0136" of JP2012-163946A can be preferably used, the contents of which are preferably incorporated herein by reference.

As a thermal acid generator (catalyst) that generates an acid using heat, for example, a thermal cationic polymerization initiator, in particular, an onium salt described in paragraphs "0035" to "0038" of JP2010-285518A or a catalyst, in particular, a sulfonic acid or a sulfonic acid amine salt described in paragraphs "0034" and "0035" of JP2005-354012A can be preferably used, the contents of which are preferably incorporated herein by reference.

In addition, a crosslinking agent, in particular, a bifunctional or higher epoxy compound or oxetane compound described in paragraphs "0032" and "0033" of JP2005-354012A, a crosslinking agent, in particular, a compound having two or more crosslinking groups at least one of which is a methylol group or an NH group described in paragraphs "0046" to "0062" of JP2006-303465A, or a compound having two or more hydroxymethyl groups or alkoxymethyl groups in a molecule described in paragraphs "0137" to "0145" of JP2012-163946A is also preferably used, the contents of which are preferably incorporated herein by reference.

A method of forming the gate insulating layer using the organic polymer is not particularly limited, and examples thereof include a method of applying a coating solution including the organic polymer and optionally curing the applied coating film.

The solvent used in the coating solution is not particularly limited as long as the organic polymer is soluble or dispersible therein, and can be appropriately selected from typically used solvents according to the kind and the like of the organic polymer.

A coating method is not particularly limited, and examples thereof include the above-described printing methods. Among these, a wet coating method such as a microgravure coating method, a dip coating method, a screen coating printing method, a die coating method, or a spin coating method is preferable.

Coating conditions are also not particularly limited and can be appropriately set.

A method and conditions for curing are not particularly limited as long as they are a method and conditions in which the organic polymer can be crosslinked. For example, the crosslinking method (radical or acid) can be appropriately set according to the kind and the like of a photoacid generator, a thermal acid generator, or the like to be used.

The inorganic oxide is not particularly limited, and examples thereof include: an oxide such as silicon oxide, silicon nitride ($SiN_Y$), hafnium oxide, titanium oxide, tantalum oxide, aluminum oxide, niobium oxide, zirconium oxide, copper oxide, or nickel oxide; a compound having a perovskite structure such as $SrTiO_3$, $CaTiO_3$, $BaTiO_3$, $MgTiO_3$, or $SrNb_2O_6$; and a composite oxide or a mixture thereof.

Examples of the silicon oxide include silicon oxide ($SIO_X$), boron phosphorus silicon glass (BPSG), phosphorus silicon glass (PSG), borosilicate glass (BSG), arsenic silicate glass (AsSG), lead silicate glass (PbSG), silicon nitride oxide (SiON), spin-on-glass (SOG), and a low dielectric constant $SiO_2$ material (for example, polarylether, a cycloperfluorocarbon polymer, benzocyclobutene, a cyclic fluororesin, polytetrafluoroethylene, fluorinated aryl ether, fluorinated polyimide, amorphous carbon, or organic SOG).

A method of forming the gate insulating layer using the inorganic oxide is not particularly limited. For example, a vacuum film formation method such as a vacuum deposition method, a sputtering method, or an ion plating or chemical vapor deposition (CVD) method can be used. In addition, the film formation may be assisted with plasma using predetermined gas, an ion gun, or a radical gun.

In addition, the gate insulating layer can also be formed by causing a precursor corresponding to each of metal oxides, specifically, a metal halide such as a chloride or a bromide, a metal alkoxide, a metal hydroxide, or the like is to react with an acid such as hydrochloric acid, sulfuric acid, or nitric acid or a base such as sodium hydroxide or potassium hydroxide in alcohol or water for hydrolysis. In a case where the solution-based process is used, the wet coating method can be used.

In a case where the gate insulating layer is formed using the inorganic oxide, in addition to the above-described method, a combination of any one of a lift-off method, a sol-gel method, an electrodeposition method, or a shadow mask method with a patterning method can also be optionally used.

The gate insulating layer may undergo a surface treatment such as a corona treatment, a plasma treatment, or an ultraviolet (UV)/ozone treatment. In this case, it is preferable that the surface roughness is not increased due to each treatment. For example, it is preferable that an arithmetic average roughness Ra or a root-mean-square roughness $R_q$ (both of which are defined according to JIS B0601:2013) of the treated gate insulating layer surface is 0.5 nm or lower.

The thickness of the gate insulating film is not particularly limited and is preferably 100 to 1000 nm.

(Source Electrode and Drain Electrode)

In the organic TFT element according to the embodiment of the present invention, the source electrode is an electrode into which a current flows from the outside through a wiring. In addition, the drain electrode is an electrode from which a current flows to the outside through a wiring.

As a material which forms the source electrode and the drain electrode, the same electrode material as that of the gate electrode can be used. Among these, a metal is preferable, and silver is more preferable.

The thickness of each of the source electrode and the drain electrode is not particularly limited and is preferably 1 nm or more and more preferably 10 nm or more. In addition, the thickness of each of the source electrode and the drain electrode is preferably 500 nm or less and more preferably 300 nm or less.

An interval (gate length) between the source electrode and the drain electrode can be appropriately determined and is, for example, preferably 200 μm or less and more preferably 100 μm or less. In addition, the gate width can be appropriately determined and is, for example, preferably 5000 μm or less and more preferably 1000 μm or less.

A method of forming the source electrode and the drain electrode is not particularly limited, and examples thereof include a method of performing vacuum deposition or sputtering using the electrode material on the substrate on which the gate electrode and the gate insulating film are formed and a method of applying or printing an electrode-forming composition to or on the substrate. In a case where the source electrode and the drain electrode are patterned, a patterning method thereof is the same as that of the gate electrode.

(Organic Semiconductor Film)

In the organic TFT element, the organic semiconductor film includes the above-described polymer according to the embodiment of the present invention. The organic semiconductor film may include one polymer or two or more polymers.

In a case where the organic semiconductor film includes the polymer according to the embodiment of the present invention, high carrier mobility and high heat resistance can be simultaneously obtained. The reason for this is not clear but is presumed to be as follows. That is, the chrysene fused ring group as the component of the polymer according to the embodiment of the present invention has a wide n-plane and can be densely packed at a position that is advantageous for a conduction path. Further, the polymer according to the embodiment of the present invention becomes "donor acceptor (D-A) polymer by being used in combination with the acceptor unit. The D-A polymer is likely to be polymerized in a molecule, and thus is presumed to be advantageous for intermolecular packing. Therefore, the carrier mobility is improved. In addition, it is presumed that air oxidation is not likely to occur even during heating, a high carrier mobility can be maintained, and high heat resistance can be exhibited.

The content of the polymer in the organic semiconductor film is not particularly limited and can be appropriately set. For example, the content of the polymer is preferably 10 mass % or higher, more preferably 30 mass % or higher, and still more preferably 50 mass % or higher. The upper limit may be 100 mass %. Ina case where the organic semiconductor film includes the binder polymer and the like, the upper limit is, for example, preferably 90 mass % or lower and more preferably 80 mass % or lower.

In addition to the polymer according to the embodiment of the present invention, the organic semiconductor film may further include the binder polymer or the additives. The binder polymer and the additives are as described above.

As each of the binder polymer and the additives, one kind may be included, or two or more kinds may be included.

The content of the binder polymer in the organic semiconductor film is not particularly limited and can be appropriately set. For example, the content of the binder is preferably 90 mass % or lower, more preferably 70 mass % or lower, and still more preferably 50 mass % or lower. The lower limit may be 0 mass % or higher and, for example, is preferably 10 mass % or higher, more preferably 15 mass % or higher, and still more preferably 20 mass % or higher.

The content of the additives in the organic semiconductor film is preferably 10 mass % or lower, more preferably 5 mass % or lower, and still more preferably 1 mass % or lower.

The thickness of the organic semiconductor film cannot be uniquely determined according to the organic semiconductor element and is, for example, preferably 10 to 500 nm and more preferably 20 to 200 nm.

The organic semiconductor film can be formed by applying the above-described organic semiconductor composition. Specifically, the organic semiconductor film can be formed by applying the above-described organic semiconductor composition to the substrate and drying the applied organic semiconductor composition.

In the present invention, the application of the organic semiconductor composition to the substrate includes an aspect in which the organic semiconductor composition is directly applied to the substrate and an aspect in which the organic semiconductor composition is applied over the substrate through another layer provided on the substrate. The other layer (a layer that is provided adjacent to the organic semiconductor layer and functions as a base of the organic semiconductor layer) to which the organic semiconductor composition is applied is necessarily determined according to the structure of the organic thin film transistor. For example, in the case of a bottom gate type, the other layer is the gate insulating film, and in the case of a top gate type (a top gate-bottom contact type or a top gate-top contact type), the other layer is the source electrode or the drain electrode.

As a coating method of the organic semiconductor composition, a typical method can be used, and examples thereof include a bar coating method, a spin coating method, a knife coating method, a doctor blade method, an ink jet printing method, a flexographic printing method, a gravure printing method, and a screen printing method. Further, as the coating method of the organic semiconductor composition, for example, a method (so-called gap casting method) of forming an organic semiconductor film described in JP2013-207085A or a method (so-called edge casting method or continuous edge casting method) of forming an organic semiconductor thin film described in WO2014/175351A can be preferably used.

For drying (drying treatment), appropriate conditions can be selected according to the kind of each of the components included in the organic semiconductor composition. Natural drying may be performed, but heating is preferable from the viewpoint of improving productivity. Heating conditions cannot be uniquely determined. For example, the heating temperature is preferably 30° C. to 250° C., more preferably 40° C. to 200° C., and still more preferably 50° C. to 150° C., and the heating time is preferably 10 to 300 minutes and more preferably 20 to 180 minutes.

(Sealing Layer)

The organic semiconductor film according to the embodiment of the present invention includes the polymer according to the embodiment of the present invention as described above and exhibits high heat resistance. Accordingly, even in a case where a heating step such as the formation of the sealing layer or the like is performed after providing the organic semiconductor, a high carrier mobility of the organic semiconductor film can be maintained.

Accordingly, in the organic thin film transistor element according to the embodiment of the present invention, it is preferable that the sealing layer is provided on the outermost layer from the viewpoint of durability. As a result, a high carrier mobility and durability can be simultaneously obtained.

For the sealing layer, a sealing agent (sealing layer-forming composition) that is typically used in the organic TFT element can be used.

It is preferable that the sealing agent is heated and dried to form the sealing layer. At this time, heating conditions cannot be uniquely determined according to the kind and the like of the sealing agent. For example, the heating temperature is preferably 50° C. to 180° C. and more preferably 60° C. to 180° C. Other conditions such as the heating time are appropriately determined according to the kind and the like of the sealing agent.

The thickness of the sealing layer is not particularly limited and is preferably 0.2 to 10 μm.

—Bottom Gate-Top Contact Type Organic Thin Film Transistor Element—

Figure 2:
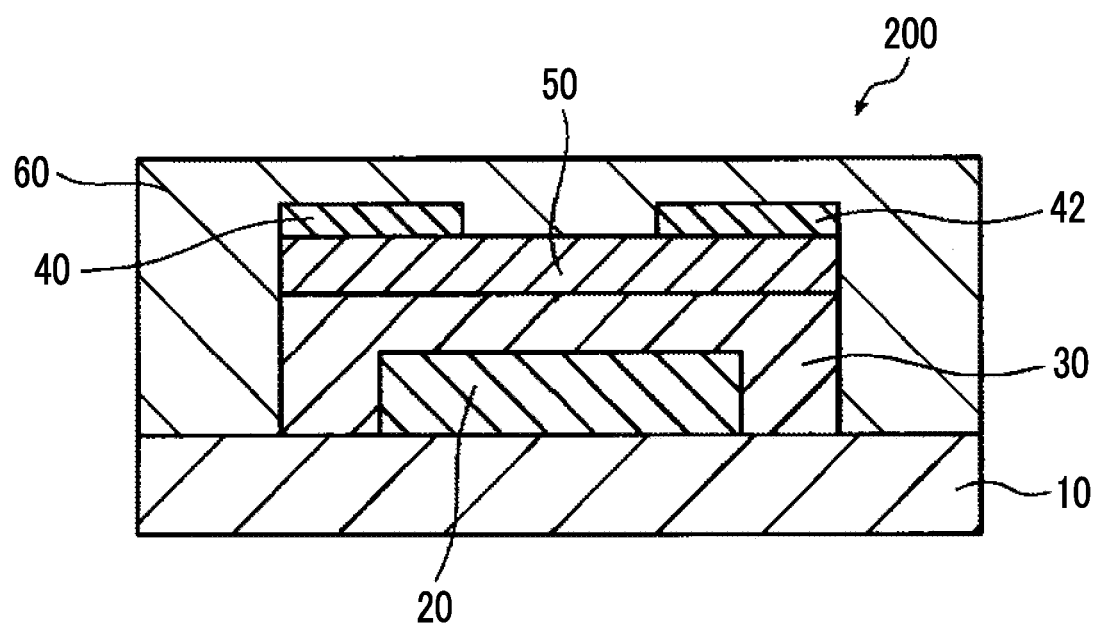
FIG. 2 is a schematic cross-sectional view showing a bottom gate-top contact type organic thin film transistor element as an example of the semiconductor element according to the embodiment of the present invention.

FIG. 2 is a schematic cross-sectional view showing a bottom gate-top contact type organic thin film transistor element 200 as an example of the semiconductor element according to the embodiment of the present invention.

As shown in FIG. 2, the organic thin film transistor element 200 includes the substrate 10, the gate electrode 20, the gate insulating film 30, the organic semiconductor film 50, the source electrode 40 and the drain electrode 42, and the sealing layer 60 in this order.

The organic thin film transistor element 200 is the same as the organic thin film transistor element 100 except for the layer configuration (stack aspect). Accordingly, the details of the substrate, the gate electrode, the gate insulating film, the source electrode, the drain electrode, the organic semiconductor film, and the sealing layer are the same as those of the bottom gate-bottom contact type organic thin film transistor element, and thus the description thereof will not be repeated.

The organic thin film transistor element 200 includes the organic semiconductor film according to the embodiment of the present invention. Accordingly, even in a case where the source electrode and the drain electrode are formed on the organic semiconductor film by applying or printing the electrode-forming composition and then heating the applied electrode-forming composition, the high carrier mobility of the organic semiconductor film can be maintained.

EXAMPLES

The present invention will be described in more detail using Examples, but the present invention is not limited to the following Examples.

Synthesis Examples

Polymers 1 to 19 used in respective examples will be described below. Regarding the polymers 4 and 19, TIPS represents a triisopropylsilyl group.

The weight-average molecular weights of the respective polymers are measured using the above-described method, and the results thereof are shown in Table 1.

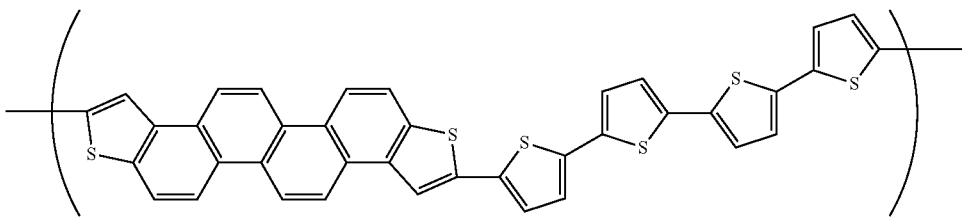

Polymer 1

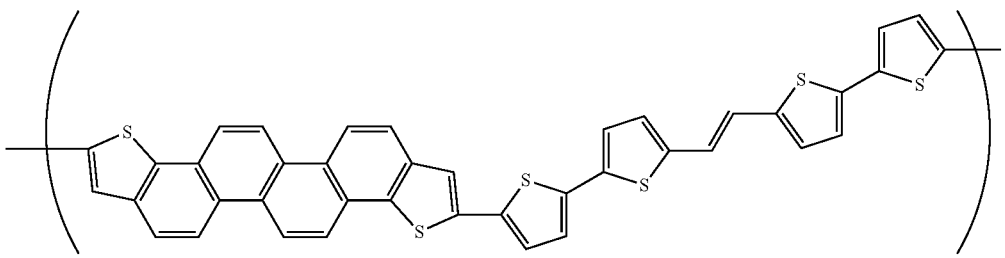

Polymer 2

-continued
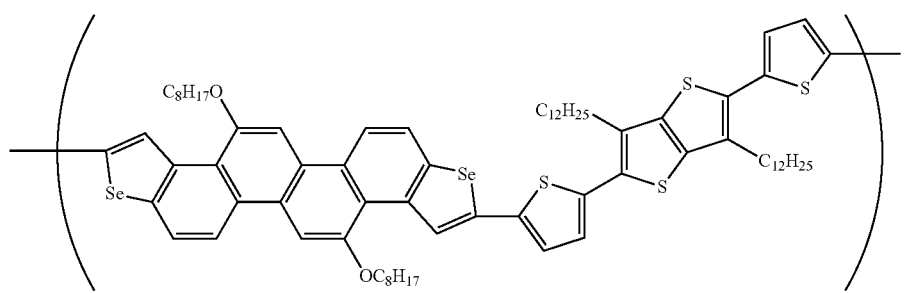
Polymer 3
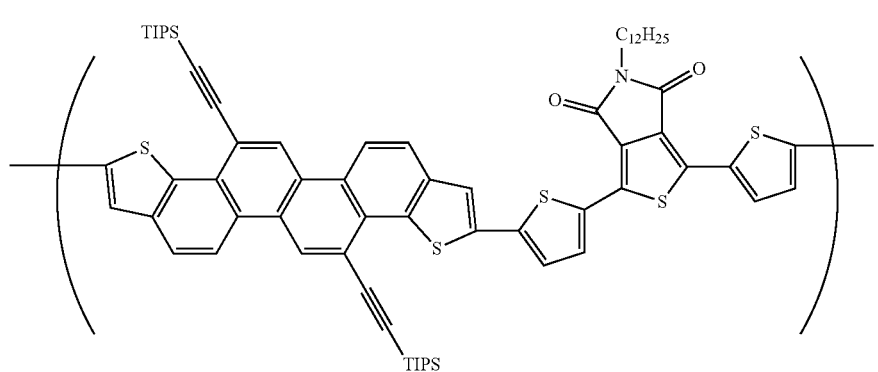
Polymer 4
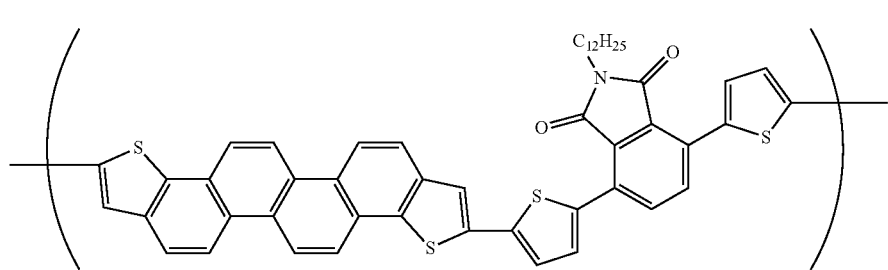
Polymer 5
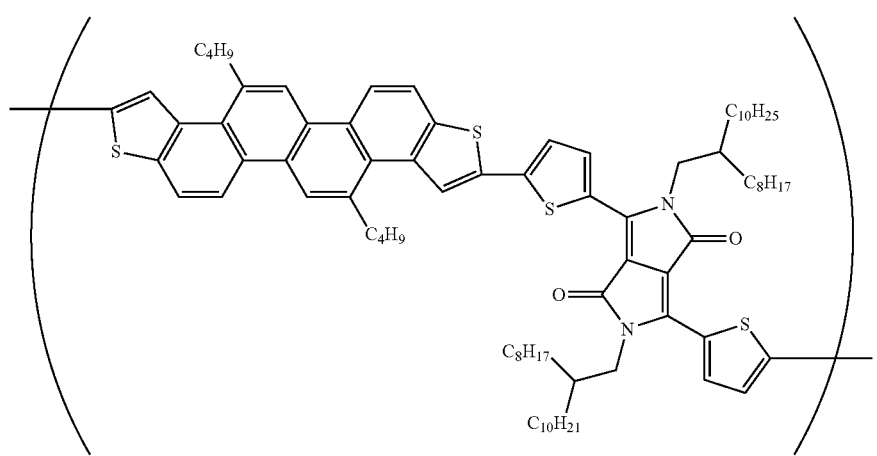
Polymer 6

Polymer 7
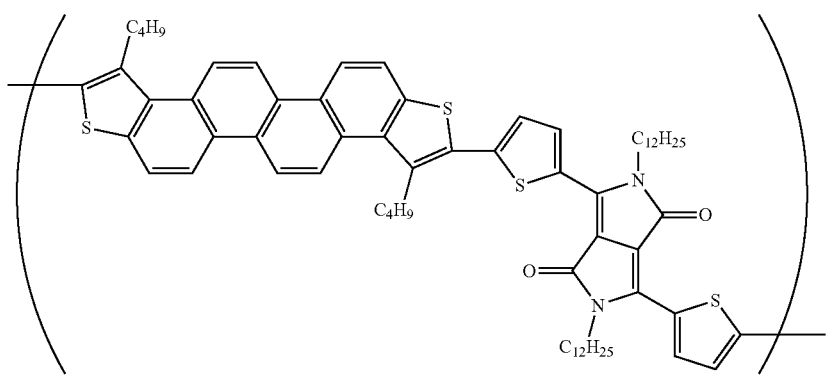
Polymer 8
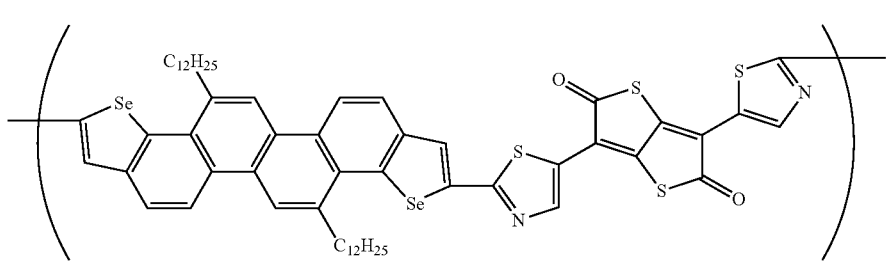
Polymer 9
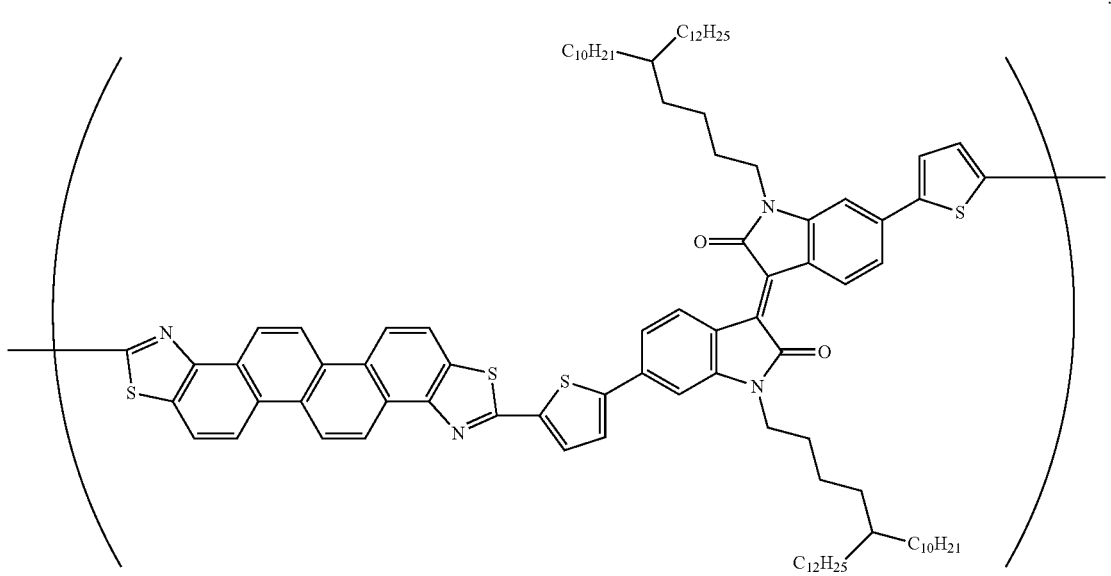
Polymer 10
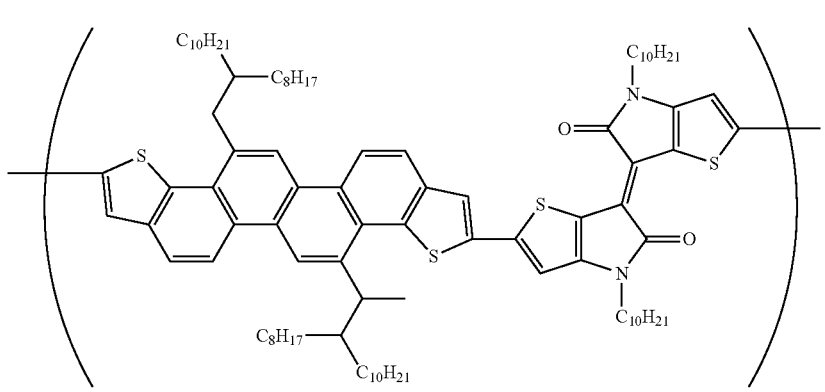

-continued
Polymer 11
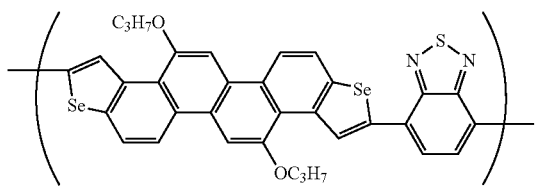
Polymer 12
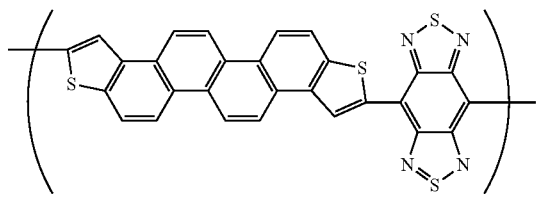
Polymer 13
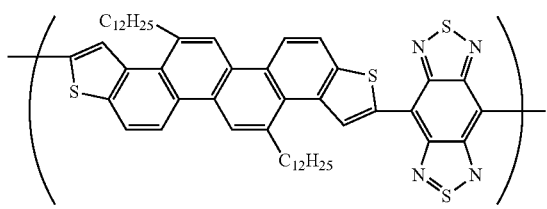
Polymer 14
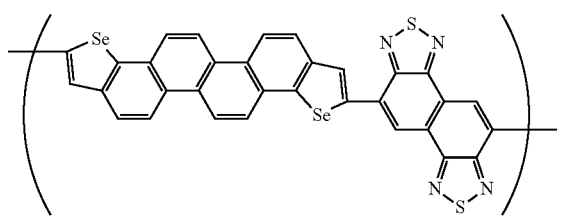
Polymer 15
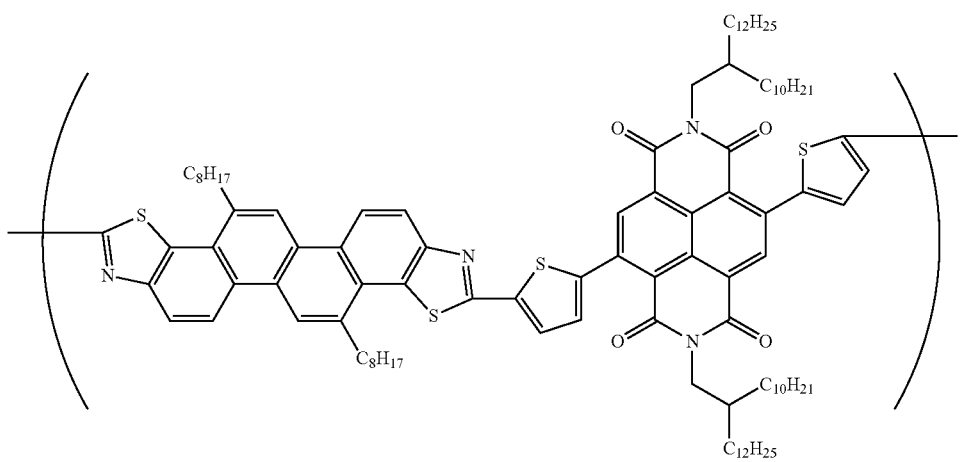
Polymer 16
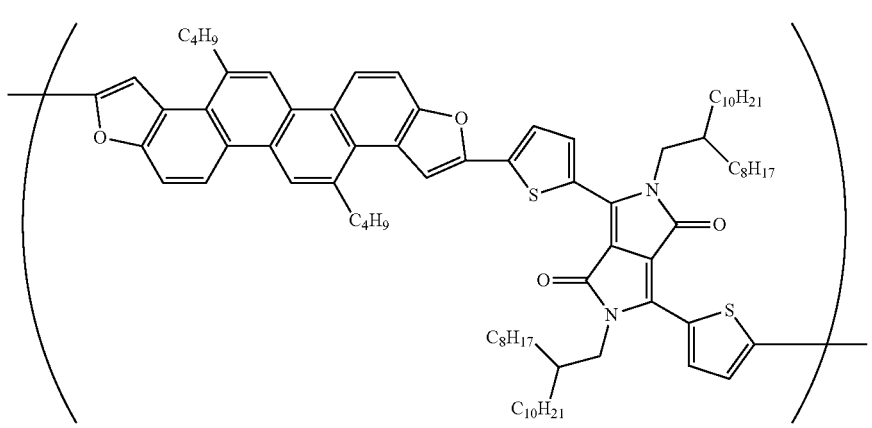

-continued

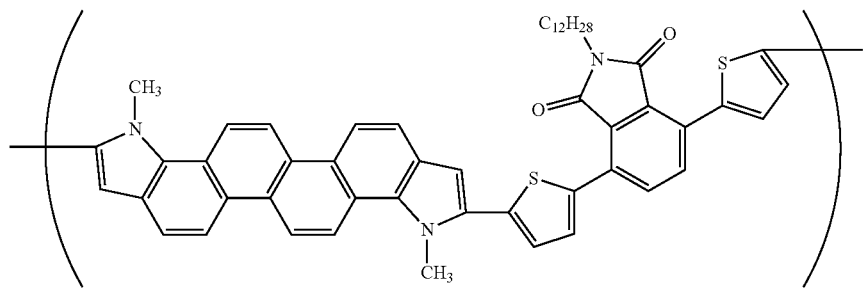
Polymer 17

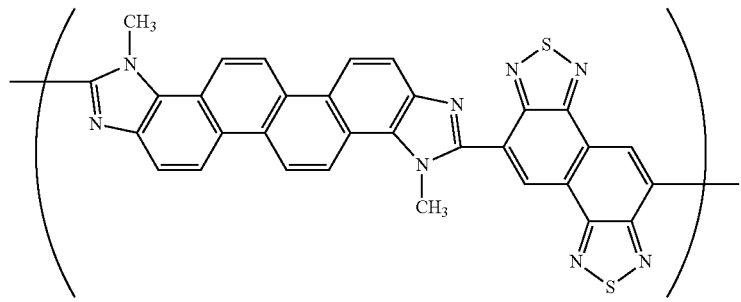
Polymer 18

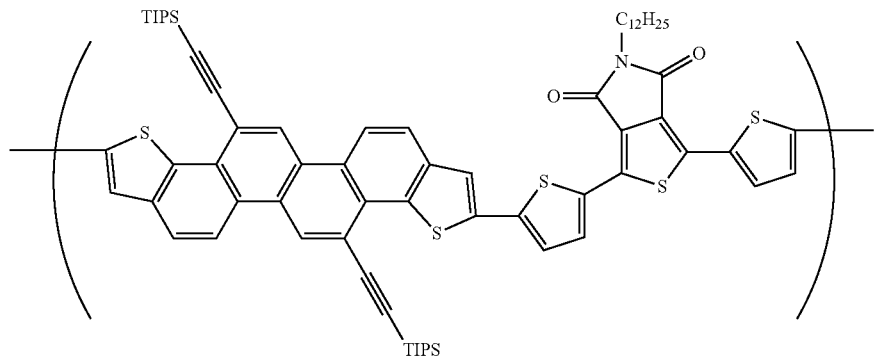
Polymer 19

Synthesis Example 1: Synthesis of Polymer 1

The polymer 1 was synthesized using the following scheme.

Abbreviations in the following scheme are as follows.

TMS represents trimethylsilyl, Xphos Pd-G₃ represents methanesulfonato(2-dicyclohexylphosphino-2',4',6'-triisopropyl-1,1'-biphenyl)(2'-amino-1,1'-biphenyl-2-yl)palladium(II), THF represents tetrahydrofuran, Me represents methyl, DMF represents N,N-dimethylformamide, TMPLi represents 2,2,6,6-tetramethylpiperidine, Pd₂(dba)₃ represents tris(dibenzylideneacetone)dipalladium, P(o-tol)₃ represents tri(o-tolyl)phosphine, and PhCl represents chlorobenzene.

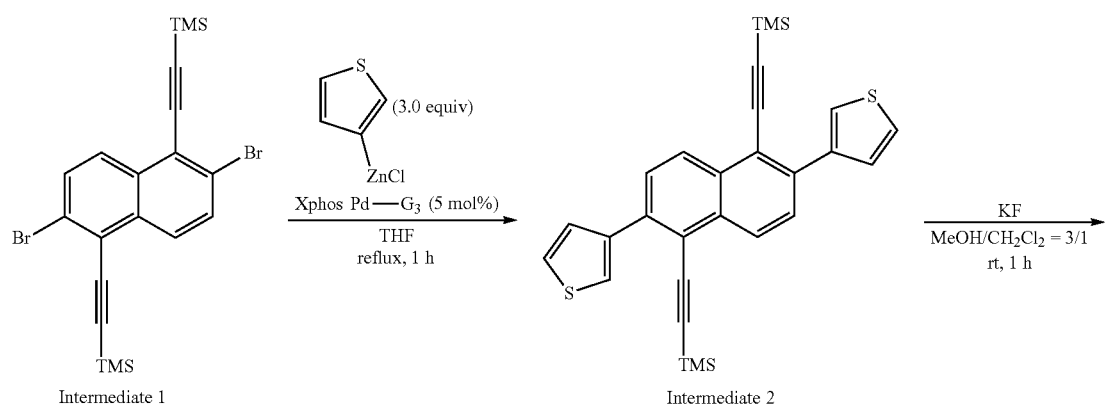

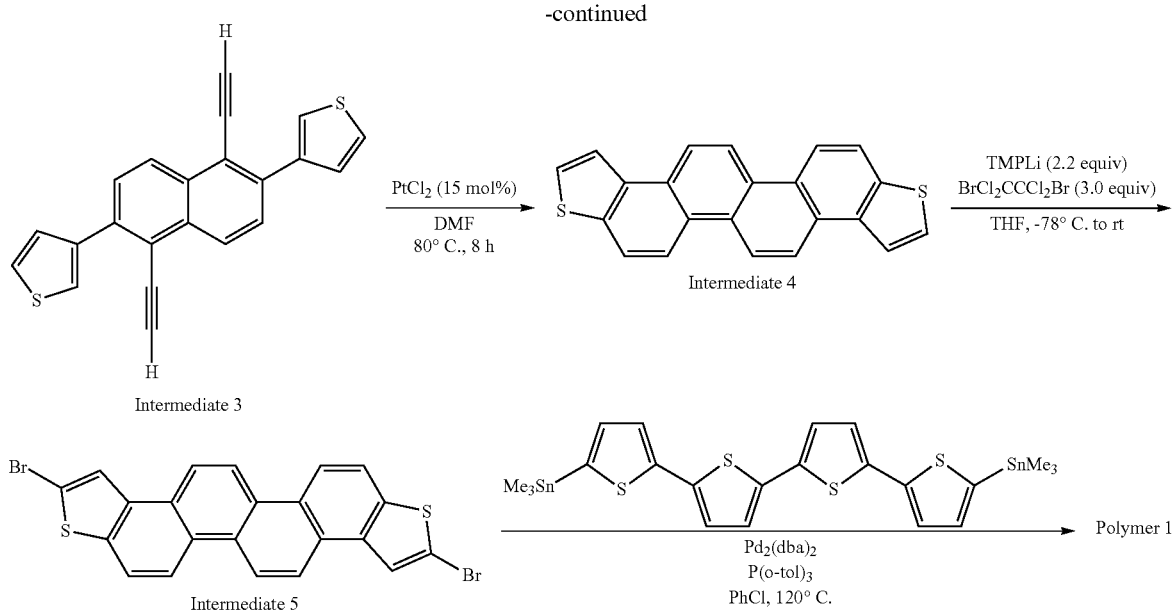

(1) Synthesis of Intermediate 2

An intermediate 1 was synthesized with reference to a method described in J. Am. Chem. Soc. 2011, 133, 5024.

The intermediate 1 (5.0 g, 10 mmol), 3-thienyl zinc chloride (0.5 M (mol/L) tetrahydrofuran solution, 60 mL), tetrahydrofuran (20 mL), and Xphos Pd-G₃ (compound name: methanesulfonato(2-dicyclohexylphosphino-2',4',6'-triisopropyl-1,1'-biphenyl)(2'-amino-1,1'-biphenyl-2-yl)palladium(II), 0.5 mmol) were mixed with each other and stirred in a nitrogen atmosphere at 80° C. (under reflux) for 1 hour. The reaction solution was cooled to room temperature, methanol was added thereto, the reaction product was extracted with chloroform, and the organic phase was concentrated under a reduced pressure. The obtained crude product was purified by silica gel chromatography. As a result, an intermediate 2 (3.8 g) was obtained.

(2) Synthesis of Intermediate 3

The intermediate 2 (3.8 g, 7.8 mmol), potassium fluoride (1.4 g, 23.4 mmol), methanol (60 mL), and chloroform (20 mL) were mixed with each other and stirred in a nitrogen atmosphere at room temperature for 1 hour. The reaction product was extracted with chloroform, the organic phase was concentrated under a reduced pressure, and the obtained crude product was purified by silica gel chromatography. As a result, an intermediate 3 (2.5 g) was obtained.

(3) Synthesis of Intermediate 4

The intermediate 3 (2.5 g, 7.3 mmol), platinum (II) chloride (0.3 g, 1.1 mmol), and dimethylformamide (80 mL) were mixed with each other and stirred in a nitrogen atmosphere at 80° C. for 8 hours. The reaction product was extracted with chloroform, the organic phase was concentrated under a reduced pressure, and the obtained crude product was purified by silica gel chromatography. As a result, an intermediate 4 (0.9 g, 2.6 mmol) was obtained.

(4) Synthesis of Intermediate 5

The intermediate 4 (0.9 g, 2.6 mmol) and tetrahydrofuran (30 mL) were mixed with each other and were cooled to −78° C. in a nitrogen atmosphere. 2,2,6,6-tetramethylpiperidine (5.7 mmol) was added dropwise, and the reaction solution was stirred at −78° C. for 1 hour. 1,2-dibromo-1,1,2,2-tetrachloroethane (7.8 mmol) was added, and the reaction solution was heated to room temperature and was stirred for 12 hours. Methanol was added to the reaction solution, and precipitates were separated by filtration and were recrystallized. As a result, an intermediate 5 (0.9 g, 1.8 mmol) was obtained.

(5) Synthesis of Polymer 1

The intermediate 5 (483 mg, 97 μmol), 5,5'-bis(trimethylstannyl)-2,2'-tetrathiophene (636 mg, 97 μmol), tri(o-tolyl)phosphine (2.4 mg, 7.7 μmol), tris(dibenzylideneacetone)dipalladium (1.8 mg, 1.9 μmol), and dehydrated chlorobenzene (3 mL) were mixed with each other and stirred in a nitrogen atmosphere at 120° C. for 24 hours. The reaction solution was cooled to room temperature, was poured into a methanol (40 mL)/concentrated hydrochloric acid (2 mL) mixed solution, and was stirred for 2 hours. Next, precipitates were separated by filtration and were cleaned with methanol. The obtained crude product was sequentially Soxhlet-extracted with methanol, acetone, and hexane, and soluble impurities were removed. Next, the reaction product was Soxhlet-extracted with chlorobenzene, the obtained solution was concentrated under a reduced pressure, and methanol was added thereto. Precipitated solids were separated by filtration, were cleaned with methanol, and were dried in a vacuum at 80° C. for 12 hours. As a result, the polymer 1 (600 mg) was obtained.

Synthesis Example 2: Synthesis of Polymer 2

Under the same conditions as in Synthesis Example 1, a polymer 2 was synthesized using the following scheme.
Abbreviations in the following scheme are the same as the abbreviations in the scheme of Synthesis Example 1 described above.

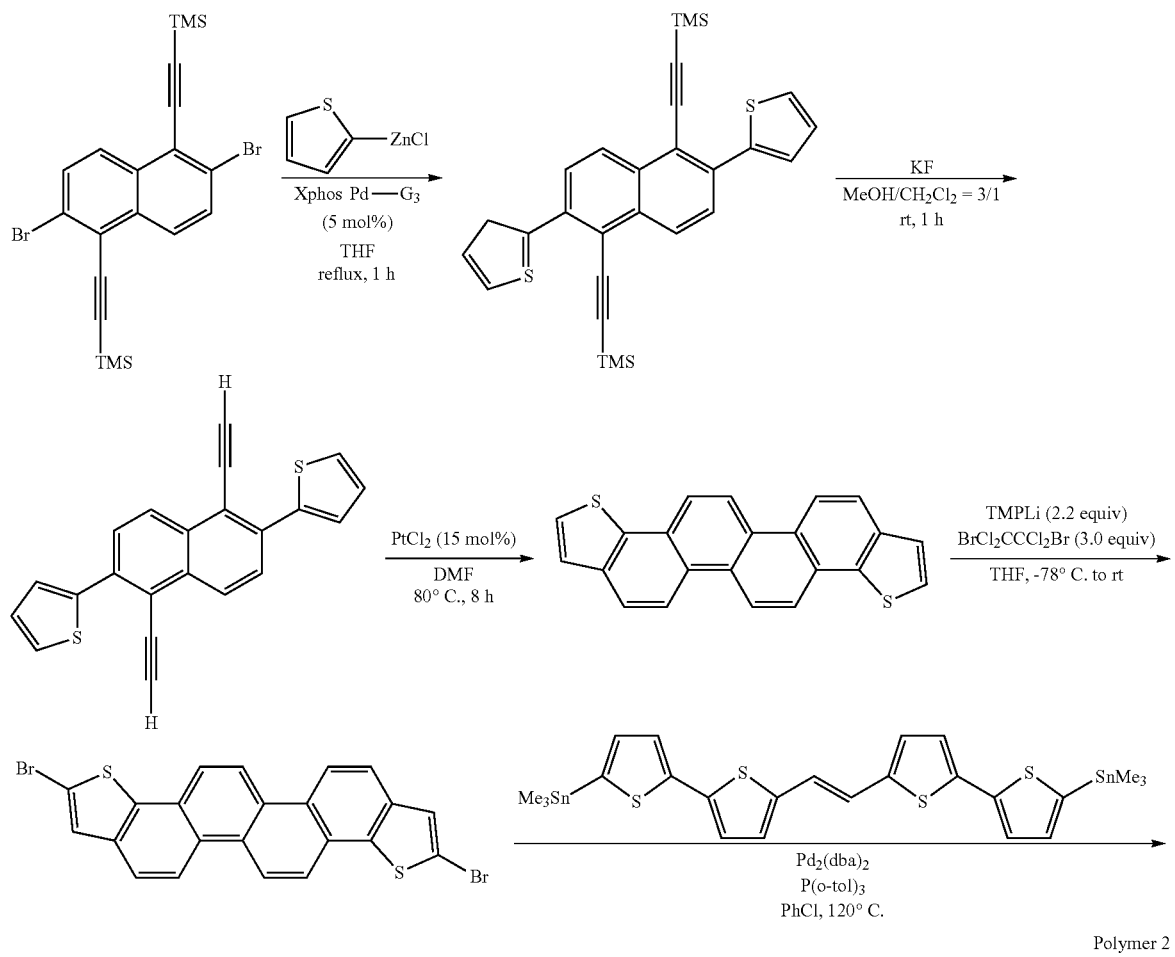

Synthesis Example 3: Synthesis of Polymers 3 to 19

Under the same conditions as in Synthesis Example 1, each of polymers 3 to 19 was synthesized.

<Compounds for Comparison>

Comparative compounds 1 to 4 shown below were prepared.

The comparative compound 1 was a compound 879 described in JP2014-078729A.

The comparative compound 2 was a compound 636 described in JP2014-078729A.

The comparative compound 3 was a compound 4 described in JP2015-032716A.

The comparative compound 4 was synthesized under the same conditions as in Synthesis Example 1 or 2.

Comparative Compound 1

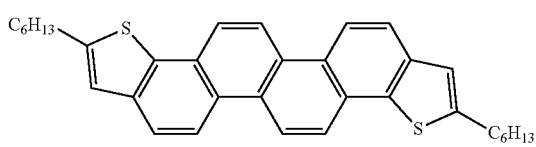

-continued

Comparative Compound 2

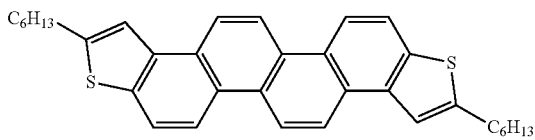

Comparative Compound 3

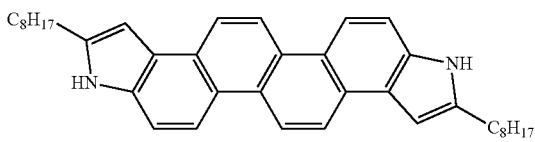

Comparative Compound 4

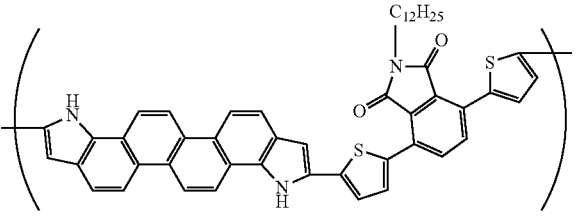

[Preparation Example of Organic Semiconductor Composition]

5 mg of the polymer or the comparative compound shown in Table 1 and 1 mL of o-dichlorobenzene were put into a glass vial and were mixed with each other and stirred using a Mix rotor (manufactured by AS ONE Corporation) at 60° C. for 24 hours. Next, the obtained solution was filtered through a membrane filter having a pore size of 0.45 μm. This way, organic semiconductor compositions 1 to 19 according to the embodiment of the present invention and comparative organic semiconductor compositions c1 to c4 were prepared.

The content of the polymer in each of the compositions was 0.38 mass %.

Example 1

The bottom gate-bottom contact type organic thin film transistor element 100 shown in FIG. 1 was manufactured, and characteristics thereof were evaluated.

<Manufacturing of Organic Thin Film Transistor Element>

Aluminum was deposited on a glass substrate (EAGLE XG: manufactured by Corning Inc., thickness: 1.1 mm) to form a gate electrode (thickness: 50 nm). A gate insulating film-forming composition (polyvinyl phenol/2,4,6-tris[bis(methoxymethyl)amino]-1,3,5-triazine=part by mass/1 part by mass of PGMEA (propylene glycol monomethyl ether acetate) solution (solid content concentration: 2 mass %)) was spin-coated on the gate electrode and was baked (heated and dried) at 150° C. for 60 minutes to form a gate insulating film having a thickness of 400 nm.

Next, silver ink (SILVER NANOCOLLOID H-1 (trade name), manufactured by Mitsubishi Materials Corporation) was printed (drawn) on the gate insulating film using an ink jet device: DMP-2831 (trade name, manufactured by Fuji Film Dimatix Inc.) in a shape of a source electrode and a drain electrode (thickness: about 100 nm, gate length: 40 μm, gate width: 100 μm). Next, the silver ink was baked using an oven at 180° C. for 30 minutes and was sintered to form the source electrode and the drain electrode. This way, an element precursor was obtained.

In a nitrogen glove box, each of the organic semiconductor compositions shown in Table 1 was spin-coated (at 200 rpm for 30 seconds) on the element precursor and was dried on a hot plate at 150° C. for hour to form an organic semiconductor layer (thickness: about 20 nm). This way, each of organic thin film transistor elements T1 to T19 according to the embodiment of the present invention and comparative organic thin film transistor elements CT1 to CT4 was manufactured.

The content of the polymer in each of the organic semiconductor layers was 100 mass %.

<Evaluation of Organic Thin Film Transistor Element>

Regarding each of the manufactured organic thin film transistor elements, the following performance evaluation was performed in air using a semiconductor characteristic evaluation device: B2900A (trade name, manufactured by Agilent Technologies Inc.). The results are shown in Table 1.

(Measurement of Carrier Mobility μ)

Regarding each of the organic thin film transistor elements T1 to T19 and CT to CT4, the carrier mobility was measured. Specifically, at 25° C., a voltage of −80 V was applied between the source electrode and the drain electrode of each of the organic thin film transistor elements, a gate voltage was caused to vary in a range of +80 V to −80 V, and a carrier mobility μ ($cm^2$Ns) was calculated using the following expression indicating a drain current $I_d$.

An evaluation rank to which the obtained carrier mobility p belongs was determined among the following evaluation ranks. The higher the carrier mobility p the better. In this test, Rank C or higher is preferable, Rank B or higher is more preferable, and Rank A or higher is still more preferable.

$$I_d = (w/2L)\mu C_i(V_g - V_{th})^2$$

In the expression, L represents the gate length, w represents the gate width, μ represents the carrier mobility, $C_i$ represents the volume of the gate insulating layer per unit area, $V_g$ represents the gate voltage, and $V_{th}$ represents a threshold voltage.

"AA": 0.15 $cm^2$Ns or higher
"A": 0.1 $cm^2$Ns or higher and lower than 0.15 $cm^2$Ns
"B": 0.05 $cm^2$Ns or higher and lower than 0.1 $cm^2$Ns
"C": 0.02 $cm^2$Ns or higher and lower than 0.05 $cm^2$Ns
"D": lower than 0.02 $cm^2$Ns (Evaluation of Heat Resistance)

Each of the organic thin film transistor elements T1 to T19 and CT1 to CT4 was heated in air at 180° C. for 20 minutes. Next, a carrier mobility $\mu_{180}$ after heating was measured using the same method as in "Measurement of Carrier Mobility μ"

A carrier mobility maintaining ratio was obtained from the following expression based on the obtained carrier mobility $\mu_{180}$ after heating and the obtained carrier mobility p. An evaluation rank to which the obtained carrier mobility maintaining ratio belongs was determined among the following evaluation ranks. The higher the carrier mobility maintaining ratio, the higher the heat resistance. In this test, Rank B or higher is preferable, Rank A or higher is more preferable, and Rank AA is still more preferable.

Carrier Mobility Maintaining Ratio=Carrier mobility $\mu_{180}$ after Heating/Carrier Mobility μ

"AA": 0.9 or higher
"A": 0.8 or higher and lower than 0.9
"B": 0.6 or higher and lower than 0.8
"C": 0.5 or higher and lower than 0.6
"D": 0.4 or higher and lower than 0.5
"E": lower than 0.4

TABLE 1

| Element No. | Organic Semiconductor Composition No. | Polymer No. | Weight-Average Molecular Weight | Carrier Mobility μ | Heat Resistance | Note |
|---|---|---|---|---|---|---|
| T1 | 1 | 1 | 45,000 | C | A | Present Invention |
| T2 | 2 | 2 | 38,000 | C | A | Present Invention |

TABLE 1-continued

| Element No. | Organic Semiconductor Composition No. | Polymer No. | Weight-Average Molecular Weight | Carrier Mobility μ | Heat Resistance | Note |
|---|---|---|---|---|---|---|
| T3 | 3 | 3 | 52,000 | C | A | Present Invention |
| T4 | 4 | 4 | 23,000 | A | AA | Present Invention |
| T5 | 5 | 5 | 47,000 | B | A | Present Invention |
| T6 | 6 | 6 | 61,000 | AA | AA | Present Invention |
| T7 | 7 | 7 | 54,000 | AA | AA | Present Invention |
| T8 | 8 | 8 | 26,000 | B | AA | Present Invention |
| T9 | 9 | 9 | 64,000 | B | AA | Present Invention |
| T10 | 10 | 10 | 35,000 | A | AA | Present Invention |
| T11 | 11 | 11 | 29,000 | B | AA | Present Invention |
| T12 | 12 | 12 | 18,000 | B | AA | Present Invention |
| T13 | 13 | 13 | 31,000 | A | AA | Present Invention |
| T14 | 14 | 14 | 24,000 | B | AA | Present Invention |
| T15 | 15 | 15 | 42,000 | B | AA | Present Invention |
| T16 | 16 | 16 | 49,000 | B | AA | Present Invention |
| T17 | 17 | 17 | 36,000 | B | B | Present Invention |
| T18 | 18 | 18 | 21,000 | B | B | Present Invention |
| T19 | 19 | 19 | 52,000 | A | A | Present Invention |
| CT1 | c1 | Comparative Compound 1 | — | D | E | Comparative Example |
| CT2 | c2 | Comparative Compound 2 | — | D | E | Comparative Example |
| CT3 | c3 | Comparative Compound 3 | — | C | D | Comparative Example |
| CT4 | c4 | Comparative Compound 4 | 17,000 | D | C | Comparative Example |

The following can be seen from the results of Table 1.

Each of the organic thin film transistor elements CT1 to CT4 included the organic semiconductor layer including the comparative compound, and thus did not have high carrier mobility and high heat resistance.

That is, in the organic thin film transistor elements CT1 and CT2 that included the organic semiconductor layers including the comparative compounds 1 and 2 as chrysenodithiophene compounds, the carrier mobility was low, and a decrease in carrier mobility caused by heating was also large. The organic thin film transistor element CT3 included the organic semiconductor layer including the comparative compound 3 as a chrysenodipyrrole compound in which a ring-constituting nitrogen atom of a pyrrole ring did not have a substituent, but did not exhibit sufficient heat resistance. Further, in the organic thin film transistor element CT4, the organic semiconductor layer included the polymer. However, this polymer included a repeating unit having a chrysenodipyrrole ring group in which a ring-constituting nitrogen atom of a pyrrole ring did not have a substituent. Therefore, the organic thin film transistor element CT4 had low carrier mobility p and low heat resistance.

On the other hand, the organic thin film transistor elements T1 to T19 according to the embodiment of the present invention included the organic semiconductor layer including the polymer according to the embodiment of the present invention, and thus had high carrier mobility and high heat resistance.

In particular, in a case where the Z ring in Formula (1) was a thiophene ring, the carrier mobility and heat resistance was able to be further improved (element Nos. T5, T17, T6, and T16). In addition, in a case where the Z ring was a pyrrole ring having a substituent, the effect of improving the carrier mobility and heat resistance was higher than that in a case where the Z ring was a pyrrole ring not having a substituent (element Nos. T17 and CT4).

In addition, in a case where the polymer including the aromatic heterocyclic group represented by $A^{12}$ in Formula (4) or (5) was included, the carrier mobility and heat resistance were able to be further improved (element Nos. T4 to T19). Further, in a case where $A^{12}$ in Formula (4) or (5) was the aromatic heterocyclic group represented by Formula (A-3), the effect of improving the carrier mobility was high, and high carrier mobility and high heat resistance were able to be obtained with a good balance (Element Nos. T6 and 17).

The present invention has been described using the embodiments. However, unless specified otherwise, any of the details of the above description is not intended to limit the present invention and can be construed in a broad sense within a range not departing from the concept and scope of the present invention disclosed in the accompanying claims.

The present application claims priority based on JP2016-074078 filed on Apr. 1, 2016, the entire content of which is incorporated herein by reference.

EXPLANATION OF REFERENCES

10: substrate
20: gate electrode
30: gate insulating film
40: source electrode
42: drain electrode
50: organic semiconductor film
60: sealing layer
100, 200: organic thin film transistor element

What is claimed is:

1. An organic semiconductor element comprising:
an organic semiconductor film that includes a polymer having a repeating unit represented by the following Formula (4) or (5),

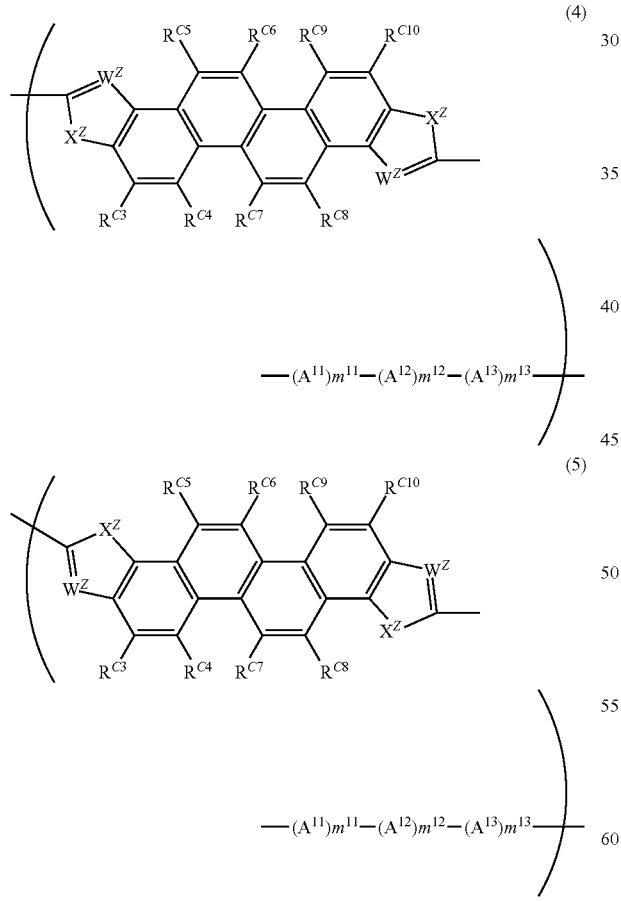

in Formula (4) or (5),
$R^{C3}$ to $R^{C10}$ each independently represent a hydrogen atom, a halogen atom, an alkyl group, an alkenyl group, an alkynyl group, an aromatic hydrocarbon group, or an aromatic heterocyclic group, $X^Z$'s each independently represent a chalcogen atom, $W^Z$'s each independently represent a nitrogen atom or $CR^W$, $R^W$ represents a hydrogen atom or a substituent, $A^{11}$ and $A^{13}$ each independently represent an aromatic hydrocarbon group, an aromatic heterocyclic group other than aromatic heterocyclic groups represented by the following Formulae (A-1) to (A-12), a vinylene group, or an ethynylene group, $A^{12}$ represents an aromatic heterocyclic group represented by any one of the following Formulae (A-1) to (A-12), $m^{11}$ and $m^{13}$ each independently represent an integer of 0 to 4, and $m^{12}$ represents an integer of 1 to 4, -continued

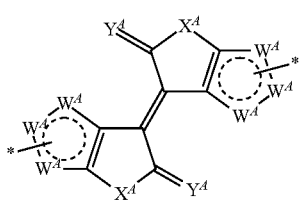 (A-6)

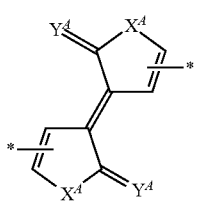 (A-7)

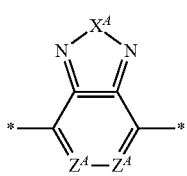 (A-8)

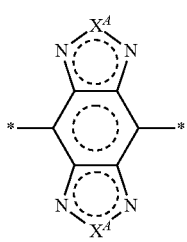 (A-9)

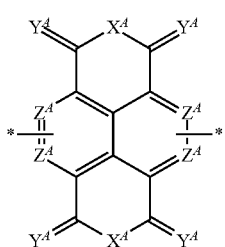 (A-10)

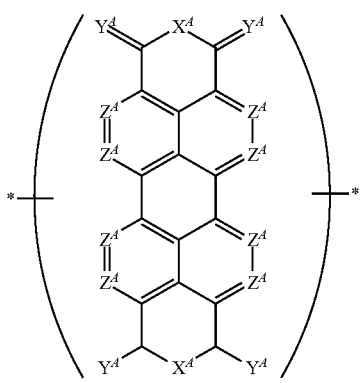 (A-11)

-continued

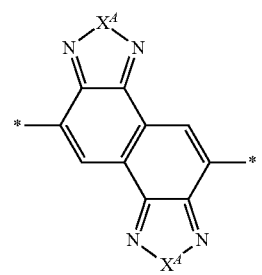 (A-12)

in Formulae (A-1) to (A-12), $X^A$'s each independently represent an oxygen atom, a sulfur atom, a selenium atom, or $NR^X$, $R^N$ and $R^X$ each independently represent an alkyl group which may have at least one of —O—, —S—, or —$NR^{43}$— in a carbon chain or a group represented by the following Formula (1-1), $Y^A$'s each independently represent an oxygen atom or a sulfur atom, $Z^A$'s each independently represent $CR^{42}$ or a nitrogen atom, $W^A$'s each independently represent $C(R^{42})_2$, $NR^{41}$, a nitrogen atom, $CR^{42}$, an oxygen atom, a sulfur atom, or a selenium atom, $R^{41}$'s each independently represent an alkyl group which may have at least one of —O—, —S—, or —$NR^{43}$— in a carbon chain, a group represented by the following Formula (1-1), or a single bond, $R^{42}$'s each independently represent a hydrogen atom, a halogen atom, an alkyl group which may have at least one of —O—, —S—, or —$NR^{43}$— in a carbon chain, or a single bond, $R^{43}$'s each independently represent a hydrogen atom or a substituent, and

* represents a binding site to another group forming the repeating unit, and $$*-L_a-Ar(-L_b)_l \qquad (1\text{-}1)$$

in Formula (1-1), $L_a$ represents an alkylene group having 1 to 20 carbon atoms which may have at least one of —O—, —S—, or —$NR^{1S}$— in a carbon chain, Ar represents an aromatic heterocyclic group or an aromatic hydrocarbon group having 6 to 18 carbon atoms, $L_b$ represents an alkyl group having 1 to 100 carbon atoms which may have at least one of —O—, —S—, or —$NR^{2S}$— in a carbon chain, $R^{1S}$ and $R^{2S}$ each independently represent a hydrogen atom or a substituent, l represents an integer of 1 to 5, and

* represents a binding site to a ring-constituting nitrogen atom in Formula (A-1) or (A-2), a nitrogen atom in $NR^X$ of $X^A$, or a nitrogen atom in $NR^{41}$ of $W^A$.

2. The organic semiconductor element according to claim 1,
wherein the sum of $m^{11}$, $m^{12}$, and $m^{13}$ is 1 or more.

3. The organic semiconductor element according to claim 1,
wherein $-(A^{11})m^{11}-$ and $-(A^{13})m^{13}-$ are each independently represented by the following Formula (Ar-1),

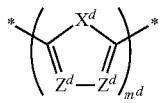
(Ar-1)

in Formula (Ar-1),
$X^d$ represents an oxygen atom, a sulfur atom, a selenium atom, or $NR^{D1}$,
$Z^d$'s each independently represent a nitrogen atom or $CR^{D2}$,
$R^{D1}$ and $R^{D2}$ represent a hydrogen atom or a substituent,
$m^d$ represents an integer of 1 to 4, and
* represents a binding site to another group forming the repeating unit.

4. The organic semiconductor element according to claim 3,
wherein $X^d$ represents a sulfur atom, and
all the $Z^d$'s represent $CR^{D2}$.

5. The organic semiconductor element according to claim 1,
wherein $X^Z$ represents an oxygen atom, a sulfur atom, or a selenium atom, and
in a case where X represents a selenium atom, $W^Z$ represents $CR^W$.

6. The organic semiconductor element according to claim 1,
wherein the organic semiconductor element is an organic thin film transistor element.

7. A polymer comprising:
a repeating unit represented by the following Formula (4) or (5), in Formula (4) or (5),
$R^{C3}$ to $R^{C10}$ each independently represent a hydrogen atom, a halogen atom, an alkyl group, an alkenyl group, an alkynyl group, an aromatic hydrocarbon group, or an aromatic heterocyclic group,
$X^Z$'s each independently represent a chalcogen atom,
$W^Z$'s each independently represent a nitrogen atom or $CR^W$,
$R^W$ represents a hydrogen atom or a substituent,
$R^{C3}$ to $R^{C10}$ have the same definitions as $R^{C3}$ to $R^{C10}$ in Formula (1),
$A^{11}$ and $A^{13}$ each independently represent an aromatic hydrocarbon group, an aromatic heterocyclic group other than aromatic heterocyclic groups represented by the following Formulae (A-1) to (A-12), a vinylene group, or an ethynylene group,
$A^{12}$ represents an aromatic heterocyclic group represented by any one of the following Formulae (A-1) to (A-12),
$m^{11}$ and $m^{13}$ each independently represent an integer of 0 to 4, and
$m^{12}$ represents an integer of 1 to 4,

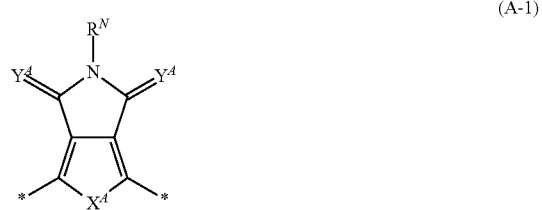
(A-1)

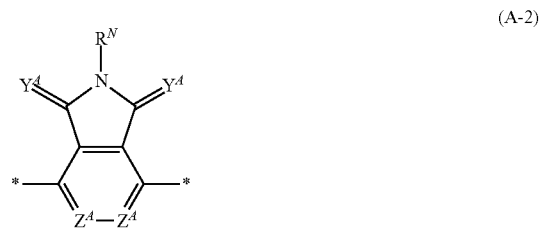
(A-2)

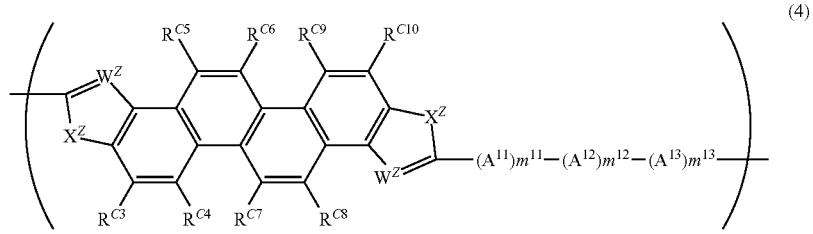
(4)

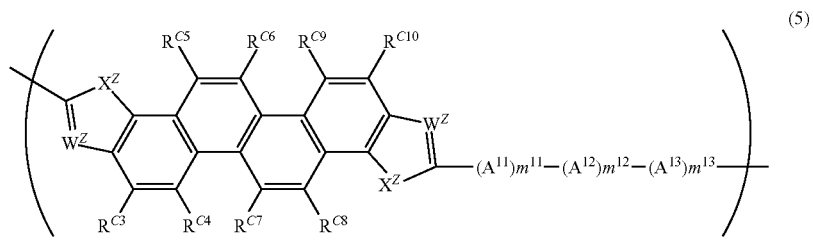
(5)

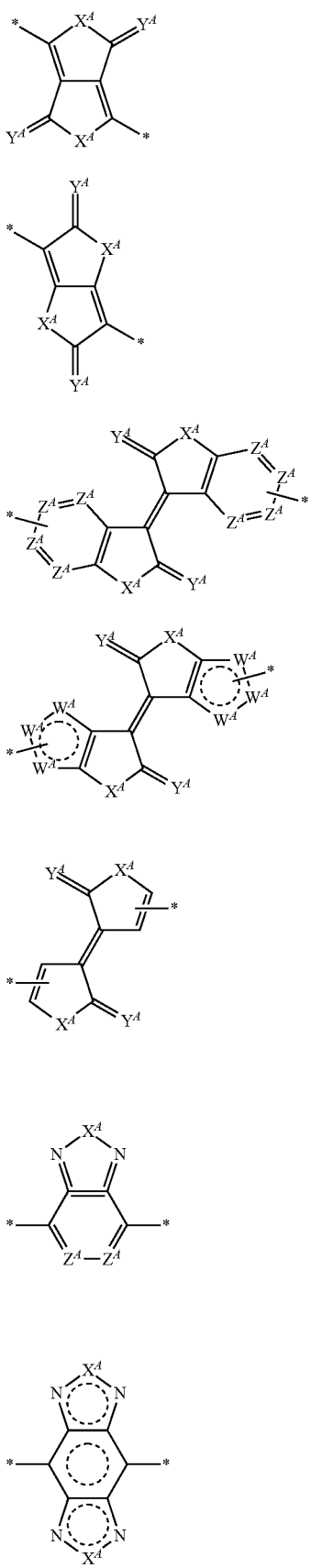

in Formulae (A-1) to (A-12), $X^A$'s each independently represent an oxygen atom, a sulfur atom, a selenium atom, or $NR^X$, $R^N$ and $R^X$ each independently represent an alkyl group which may have at least one of —O—, —S—, or —$NR^{43}$— in a carbon chain or a group represented by the following Formula (1-1), $Y^A$'s each independently represent an oxygen atom or a sulfur atom, $Z^A$'s each independently represent $CR^{42}$ or a nitrogen atom, $W^A$'s each independently represent $C(R^{42})_2$, $NR^{41}$, a nitrogen atom, $CR^{42}$, an oxygen atom, a sulfur atom, or a selenium atom, $R^{41}$'s each independently represent an alkyl group which may have at least one of —O—, —S—, or —NR$^{43}$— in a carbon chain, a group represented by the following Formula (1-1), or a single bond, $R^{42}$'s each independently represent a hydrogen atom, a halogen atom, an alkyl group which may have at least one of —O—, —S—, or —NR$^{43}$— in a carbon chain, or a single bond, $R^{43}$'s each independently represent a hydrogen atom or a substituent, and

* represents a binding site to another group forming the repeating unit, and $$*\text{-}L_a\text{-}Ar\text{-}(L_b)_l \qquad (1\text{-}1)$$

in Formula (1-1), $L_a$ represents an alkylene group having 1 to 20 carbon atoms which may have at least one of —O—, —S—, or —NR$^{1S}$— in a carbon chain, Ar represents an aromatic heterocyclic group or an aromatic hydrocarbon group having 6 to 18 carbon atoms, $L_b$ represents an alkyl group having 1 to 100 carbon atoms which may have at least one of —O—, —S—, or —NR$^{2S}$— in a carbon chain, $R^{1S}$ and $R^{2S}$ each independently represent a hydrogen atom or a substituent, l represents an integer of 1 to 5, and

* represents a binding site to a ring-constituting nitrogen atom in Formula (A-1) or (A-2), a nitrogen atom in NR$^X$ of X$^4$, or a nitrogen atom in NR$^{41}$ of W$^4$.

8. The polymer according to claim 7, wherein the sum of m$^{11}$, m$^{12}$, and m$^{13}$ is 1 or more.

9. The polymer according to claim 7, wherein -(A$^{11}$)m$^{11}$- and -(A$^{13}$)m$^{13}$- are each independently represented by the following Formula (Ar-1),

in Formula (Ar-1),

X$^d$ represents an oxygen atom, a sulfur atom, a selenium atom, or NR$^{D1}$,

Z$^d$'s each independently represent a nitrogen atom or CR$^{D2}$,

R$^{D1}$ and R$^{D2}$ represent a hydrogen atom or a substituent, m$^d$ represents an integer of 1 to 4, and

* represents a binding site to another group forming the repeating unit.

10. The polymer according to claim 9, wherein X$^d$ represents a sulfur atom, and all the Z$^d$'s represent CR$^{D2}$.

11. The polymer according to claim 7, wherein X$^Z$ represents an oxygen atom, a sulfur atom, or a selenium atom, and in a case where X$^Z$ represents a selenium atom, W$^Z$ represents CR$^W$.

12. An organic semiconductor composition comprising: the polymer according to claim 7; and a solvent.

13. An organic semiconductor film comprising: the polymer according to claim 7.

* * * * *